United States Patent
Lee

(10) Patent No.: US 11,776,950 B2
(45) Date of Patent: *Oct. 3, 2023

(54) INTEGRATED CIRCUIT INCLUDING CELLS WITH DIFFERENT HEIGHTS AND METHOD OF DESIGNING THE SAME

(71) Applicant: SAMSUNG ELECTRONICS CO., LTD., Suwon-si (KR)

(72) Inventor: Bonghyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/951,381

(22) Filed: Sep. 23, 2022

(65) Prior Publication Data
US 2023/0019421 A1 Jan. 19, 2023

Related U.S. Application Data

(63) Continuation of application No. 17/136,754, filed on Dec. 29, 2020, now Pat. No. 11,495,592.

(30) Foreign Application Priority Data

Jul. 1, 2020 (KR) ........................ 10-2020-0081066

(51) Int. Cl.
| | | |
|---|---|---|
| *H01L 27/02* | (2006.01) | |
| *G06F 30/392* | (2020.01) | |
| *H01L 23/528* | (2006.01) | |
| *H01L 27/092* | (2006.01) | |

(52) U.S. Cl.
CPC ........ *H01L 27/0207* (2013.01); *G06F 30/392* (2020.01); *H01L 23/5286* (2013.01); *H01L 27/0924* (2013.01)

(58) Field of Classification Search
CPC ............. H01L 27/0207; H01L 23/5286; H01L 27/0924; H01L 2027/11875; H01L 21/823878; H01L 27/092; H01L 27/0203; G06F 30/392; G06F 2115/06; H10B 41/20; H10B 43/20
See application file for complete search history.

(56) References Cited

U.S. PATENT DOCUMENTS

| | | |
|---|---|---|
| 7,299,440 B2 | 11/2007 | Yoshida et al. |
| 7,800,409 B2 | 9/2010 | Pitts |
| 8,357,955 B2 | 1/2013 | Tanaka |
| 8,631,377 B2 | 1/2014 | Lee et al. |
| 8,698,205 B2 | 4/2014 | Tzeng et al. |
| 8,878,303 B2 | 11/2014 | Hatamian et al. |

(Continued)

*Primary Examiner* — Karen Kusumakar
*Assistant Examiner* — Adam S Bowen
(74) *Attorney, Agent, or Firm* — Sughrue Mion, PLLC

(57) ABSTRACT

An IC includes: a plurality of first cells placed in a series of first rows extending in a first horizontal direction and each having a first height; and a plurality of second cells placed in a series of second rows extending in the first horizontal direction and each having a second height different from the first height, wherein a total height of the series of first rows corresponds to a multiple of a height of a first multi-height cell with a maximum height among the plurality of first cells, and a total height of the series of second rows corresponds to a multiple of a height of a second multi-height cell with a maximum height among the plurality of second cells.

20 Claims, 19 Drawing Sheets

(56) References Cited

U.S. PATENT DOCUMENTS

| | | | |
|---|---|---|---|
| 9,449,136 B2 | 9/2016 | Pan et al. | |
| 9,697,319 B2* | 7/2017 | Lee | G06F 30/392 |
| 9,996,657 B2 | 6/2018 | Chen et al. | |
| 10,868,538 B1* | 12/2020 | Wang | H01L 23/528 |
| 2011/0049575 A1* | 3/2011 | Tanaka | H01L 27/11807 |
| | | | 257/E27.013 |
| 2016/0147926 A1* | 5/2016 | Chiang | G06F 30/39 |
| | | | 716/122 |
| 2017/0116365 A1* | 4/2017 | Cheng | G06F 30/39 |
| 2017/0277819 A1* | 9/2017 | Kim | G06F 30/39 |
| 2018/0166386 A1 | 6/2018 | Biswas et al. | |
| 2019/0148407 A1 | 5/2019 | Guo et al. | |
| 2019/0164949 A1 | 5/2019 | Sio et al. | |
| 2019/0286783 A1 | 9/2019 | Yang et al. | |
| 2020/0019667 A1 | 1/2020 | Lin et al. | |
| 2020/0104446 A1 | 4/2020 | Li et al. | |
| 2020/0104462 A1 | 4/2020 | Chen et al. | |
| 2020/0357786 A1* | 11/2020 | Sio | H01L 27/0924 |
| 2021/0224455 A1* | 7/2021 | Ou | G06F 30/392 |

\* cited by examiner

INTEGRATED CIRCUIT INCLUDING CELLS WITH DIFFERENT HEIGHTS AND METHOD OF DESIGNING THE SAME

CROSS-REFERENCE TO THE RELATED APPLICATION

This application is a Continuation application of U.S. application Ser. No. 17/136,754 filed on Dec. 29, 2020, which is based on and claims priority under 35 U.S.C. § 119 to Korean Patent Application No. 10-2020-0081066 filed on Jul. 1, 2020, in the Korean Intellectual Property Office, the disclosures of which are incorporated by reference herein in their entireties.

BACKGROUND

The disclosure relates to an integrated circuit (IC) and, more particularly, to an IC including cells with different heights and a method of designing the IC.

An IC may have a high level of integration due to the development of a semiconductor process and may also be required to have high performance. For example, small-sized devices, e.g., transistors, may be desirable to effect a decrease in an area of an IC, and large-sized devices may be desirable to effect an increase in an operating speed of an IC. Therefore, to achieve functions and an operating speed required for a particular IC, it may be significant to design an IC by taking into account both a level of integration and performance.

SUMMARY

The disclosure provides an integrated circuit (IC) including cells with different heights to take into account both a level of integration and performance and a method of designing the IC.

According to an aspect of the inventive concept, there is provided an IC including: a plurality of first cells placed in a series of first rows, the series of first rows extending in a first horizontal direction and each first row of the series first rows having a first height; and a plurality of second cells placed in a series of second rows, the series of second rows extending in the first horizontal direction and each second row of the series of second rows having a second height different from the first height, wherein a sum of heights of all first rows of the series of first rows corresponds to a multiple of a height of a first multi-height cell that has a maximum height among the plurality of first cells, and a sum of heights of all second rows of the series of second rows corresponds to a multiple of a height of a second multi-height cell that has a maximum height among the plurality of second cells.

According to another aspect of the inventive concept, there is provided an IC including: a series of first power rails extending in a first horizontal direction in parallel to each other with a first pitch; a plurality of first cells each configured to receive a first supply voltage or a second supply voltage from at least one power rail of the series of first power rails; a series of second power rails extending in the first horizontal direction in parallel to each other with a second pitch different from the first pitch; and a plurality of second cells each configured to receive the first supply voltage or the second supply voltage from at least one power rail of the series of second power rails, wherein a pitch between outer first power rails among the series of first power rails corresponds to a multiple of a height of a first multi-height cell that has a maximum height among the plurality of first cells, and a pitch between outer second power rails among the series of second power rails corresponds to a multiple of a height of a second multi-height cell that has a maximum height among the plurality of second cells.

According to another aspect of the inventive concept, there is provided a method, performed by at least one processor configured to execute a series of instructions, of designing an IC, the method including: obtaining input data defining cells with different heights; extracting, from the input data, a plurality of first cells with a height corresponding to a multiple of a first height; detecting a first multi-height cell with a maximum height among the plurality of first cells; determining a row count of a series of first rows each having the first height, based on the maximum height of the first multi-height cell; placing at least some of the plurality of first cells in the series of first rows; and generating output data defining the placed cells, wherein at least one cell of the placed cells has a different height from a height of at least one other cell of the placed cells.

BRIEF DESCRIPTION OF THE DRAWINGS

The above and other aspects, features, and advantages of certain embodiments of the disclosure will be more apparent from the following description taken in conjunction with the accompanying drawings in which.

DETAILED DESCRIPTION OF THE EMBODIMENTS

Figure 1:
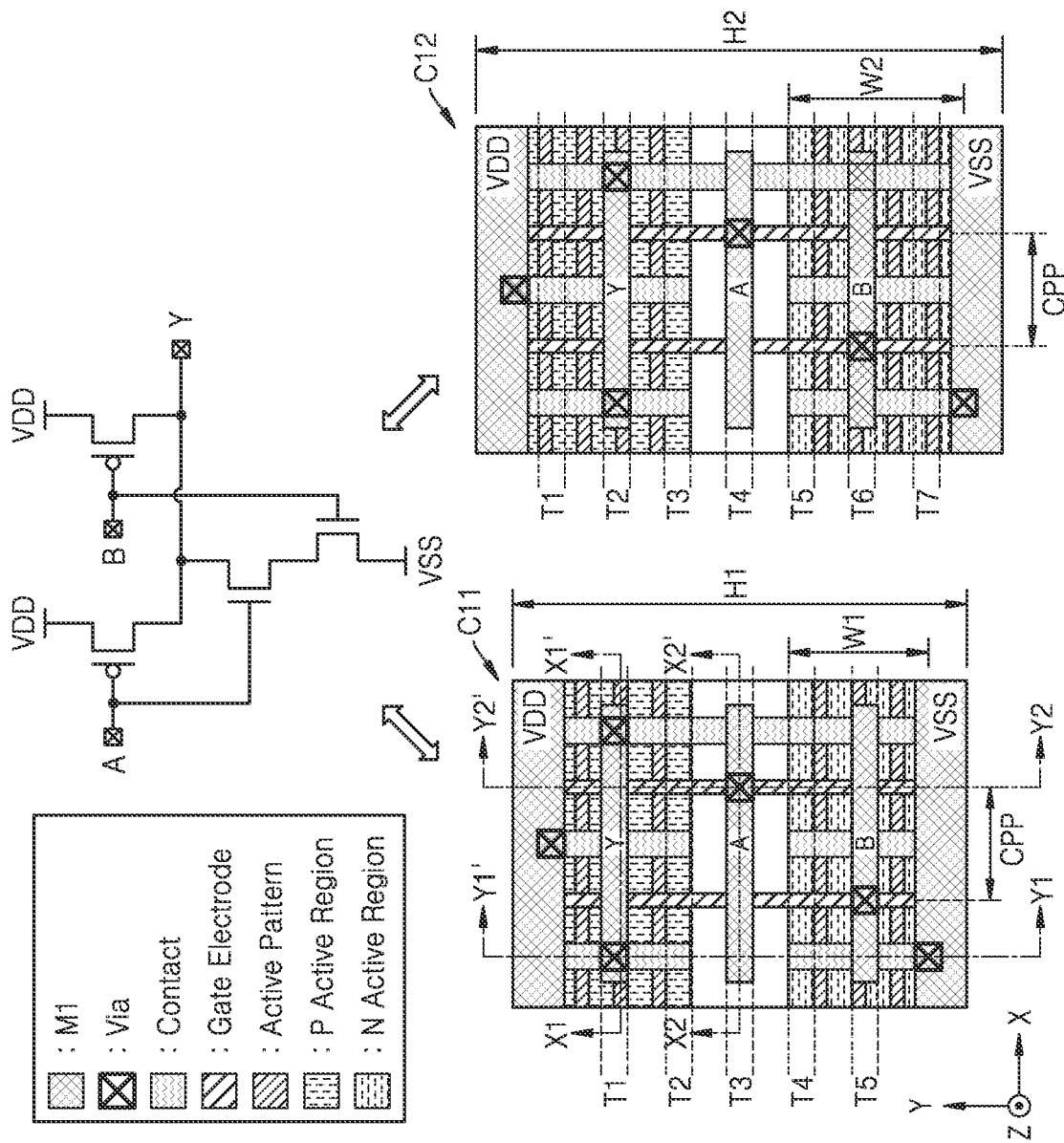
FIG. 1 is a view of cells according to an embodiment.
Figure 2:
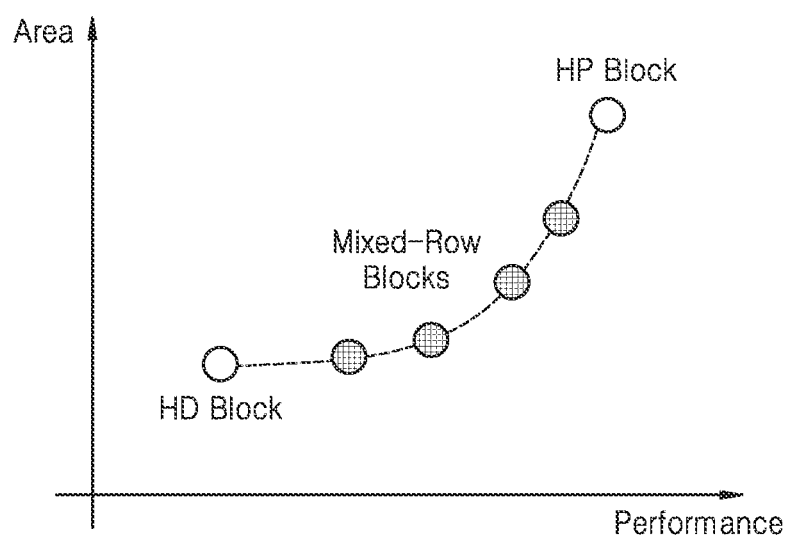
FIG. 2 is a graph showing a relationship between performance and an area of an integrated circuit (IC), according to an embodiment.

FIG. 1 is a view of cells according to an example embodiment, and FIG. 2 is a graph showing a relationship between performance and an area of an integrated circuit (IC), according to an example embodiment. Particularly, an upper part of FIG. 1 indicates a circuit diagram of a two-input NAND gate NAND2, and a lower part of FIG. 1 schematically indicates layouts of first and second cells C11 and C12 corresponding to the two-input NAND gate NAND2, on a plane formed by an X-axis and a Y-axis. Herein, an X-axis direction and a Y-axis direction may be referred to as a first horizontal direction and a second horizontal direction, respectively, and a Z-axis direction may be referred to as a vertical direction. The plane formed by the X-axis and the Y-axis may be referred to as a horizontal plane, a component relatively placed in a +Z direction than another component may be referred to as a component over another component, and a component relatively placed in a −Z direction than another component may be referred to as a component below another component. In addition, an area of a component may indicate a size occupied by the component on a plane parallel to the horizontal plane, and a height of the component may indicate a length of the component in the Y-axis direction. In the drawings herein, only some layers may be shown for convenience of drawing, and to indicate a connection between a pattern of a wiring layer and a lower pattern, a via may be shown even though the via is below the pattern of the wiring layer.

An IC may include a plurality of cells. A cell is a unit of a layout included in an IC, may be designed to perform a pre-defined function, and may be referred to as a standard cell. An IC may include a plurality of various cells, and the cells may be aligned along a plurality of rows. For example, referring to FIG. 1, the first and second cells C11 and C12 may be on rows extending in the X-axis direction, respectively. In a boundary between rows, patterns (may be referred to as power lines or power rails herein) to which each of a positive supply voltage VDD and a negative supply voltage VSS (or a ground potential) is applied may extend in the X-axis direction, and an active region in which a P-type transistor is formed and an active region in which an N-type transistor is formed may extend in the X-axis direction. Like the first and second cells C11 and C12, a cell placed in a single row may be referred to as a single height cell, and like some cells C14, C15, C17, and the like of FIG. 4, a cell continuously placed in two or more adjacent rows may be referred to as a multiple height cell or a multi-height cell.

As shown in FIG. 1, at least one active pattern in an active region may extend in the X-axis direction, and the active pattern may form a transistor by intersecting with a gate electrode extending in the Y-axis direction. When a fin-shaped active pattern extends in the X-axis direction, a transistor formed by the active pattern and a gate electrode may be referred to as a fin field effect transistor (FinFET). As described below with reference to FIGS. 3A to 3D, example embodiments will be described mainly with reference to cells including a FinFET, but it will be understood that the example embodiments may also be applied to cells including a transistor having a different structure from the FinFET. For example, an active pattern may include a plurality of nanosheets separated from each other in the Z-axis direction and extending in the X-axis direction, and a cell may include a multi-bridge channel FET (MBCFET) formed by the plurality of nanosheets and a gate electrode. Alternatively, the cell may include a ForkFET having a structure in which an N-type transistor is relatively close to a P-type transistor by isolating nanosheets for the P-type transistor from nanosheets for the N-type transistor by a dielectric wall. Alternatively, the cell may include a vertical FET (VFET) having a structure in which source/drain regions are separated from each other in the Z-axis direction with a channel region therebetween, and a gate electrode encompasses the channel region. Alternatively, the cell may include an FET such as a complementary FET (CFET), a negative CFET (NCFET), or a carbon nanotube (CNT) FET, or include a bipolar junction transistor or another three-dimensional transistor.

Referring to FIG. 1, the two-input NAND gate NAND2 may have first and second inputs A and B and an output Y and include two n-type FETs (NFETs) and two p-type FETs (PFETs). The first and second cells C11 and C12 may provide the same function but have different performances. For example, each of the first and second cells C11 and C12 may generate the output Y by performing a NAND logic operation on the first and second inputs A and B and may have different driving strengths and operating speeds from each other. For example, the second cell C12 may have a larger area than the first cell C11 and provide a higher driving strength and operating speed than the first cell C11. Herein, a cell having a relatively small area, such as the first cell C11, may be referred to as a high density (HD) cell, and a region in which HD cells are placed and a block including HD cells may be referred to as an HD region and an HD block, respectively. In addition, a cell providing a relatively high performance, such as the second cell C12, may be referred to as a high performance (HP) cell, and a region in which HP cells are placed and a block including HP cells may be referred to as an HP region and an HP block, respectively. As shown in FIG. 1, the first cell C11 as an HD cell may have a first height H1 as a length in the Y-axis direction, and the second cell C12 as an HP cell may have a second height H2, greater than the first height H1, as a length in the Y-axis direction (H2>H1). Accordingly, the first cell C11 may be placed in rows having the first height H1, and the second cell C12 may be placed in rows having the second height H2.

Referring to FIG. 2, an HD block including only HD cells may have the smallest area and provide the lowest performance, whereas an HP block including only HP cells may provide the highest performance and have the greatest area. The HD block may include HD cells placed in rows having a relatively small height, e.g., the first height H1, and the HP block may include HP cells placed in rows having a relatively large height, e.g., the second height H2. An IC may have requirements including performance higher than the performance provided by only the HD block and an area smaller than the area of only the HP block, and accordingly, as shown in FIG. 2, mixed-row blocks may be employed. That is, the mixed-row blocks may include HD cells (e.g., C11 of FIG. 1) placed in rows having the first height H1 and HP cells (e.g., C12 of FIG. 1) placed in rows having the second height H2, and accordingly, the performance and the area corresponding to the requirements of an IC may be provided.

In a mixed-row block, it may be required to appropriately configure rows in which HD cells are placed (i.e., HD rows) and rows in which HP cells are placed (i.e., HP rows). For example, the row count of consecutively placed HD rows, i.e., a series of HD rows and the row count of consecutively placed HP rows, i.e., a series of HP rows may be determined in a floorplan process of an IC, and then, HD cells may be placed in the HD rows, and HP cells may be placed in the HP rows. As described below with reference to the drawings, mixed-row blocks providing an optimal area and performance may be achieved, and accordingly, an IC satisfying a performance requirement and having a high level of integration may be provided. In addition, an IC satisfying the requirements may be easily designed, and accordingly, a time-to-market of the IC may be remarkably reduced.

Referring back to FIG. 1, an active region in which an N-type transistor is formed (or an active region in which a P-type transistor is formed) in the first cell C11 as an HD cell may have a first width W1 as a length in the Y-axis direction, whereas an active region in which an N-type transistor is formed (or an active region in which a P-type transistor is formed) in the second cell C12 may have a second width W2 as a length in the Y-axis direction greater than the first width W1 (W2>W1). In addition, the first cell C11 may include six active patterns extending in parallel to each other in the X-axis direction, whereas the second cell C12 may include eight active patterns extending in parallel to each other in the X-axis direction. In addition, the first and second cells C11 and C12 may include patterns aligned and placed on tracks extending to be parallel to each other in the X-axis direction in a first wiring layer M1, wherein the first cell C11 may have five available tracks T1 to T5, whereas the second cell C12 may have seven available tracks T1 to T7. However, as shown in FIG. 1, a pitch CPP between gate electrodes included in the first cell C11 may be the same as the pitch CPP between gate electrodes included in the second cell C12, and accordingly, in a mixed-row block, although the first and second cells C11 and C12 may be placed in rows having different heights, respectively, the gate electrodes in the first cell C11 and the gate electrodes in the second cell C12 may be aligned in the Y-axis direction. In other words, in a case when the first and second cells C11 and C12 are adjacent to each other in the Y-axis direction, the first and second gate electrodes of the first cell C11 may be collinear with the first and second gate electrodes, respectively, of the second cell C12.

Figure 3A:
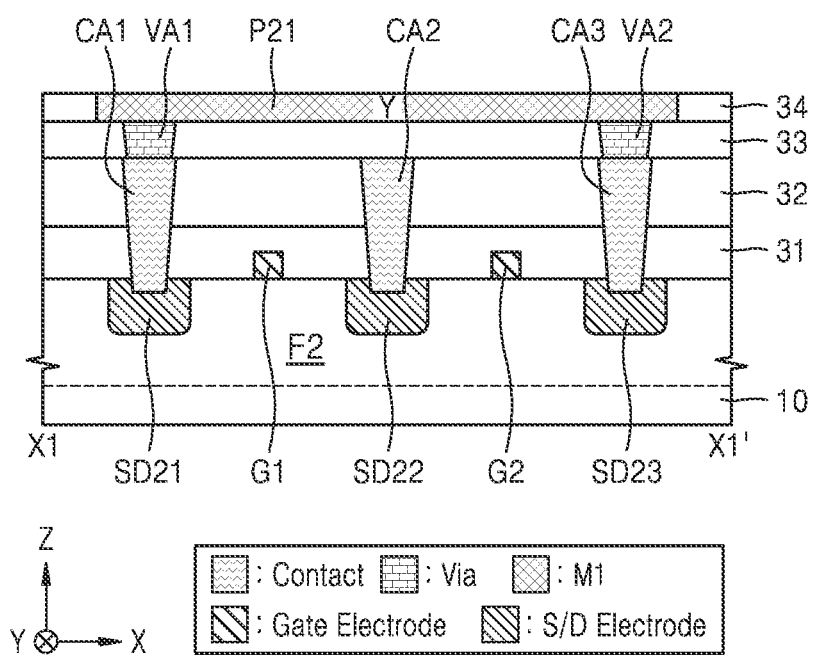
FIGS. 3A to 3D are cross-sectional views of structures of cells according to an embodiment.
Figure 3B:
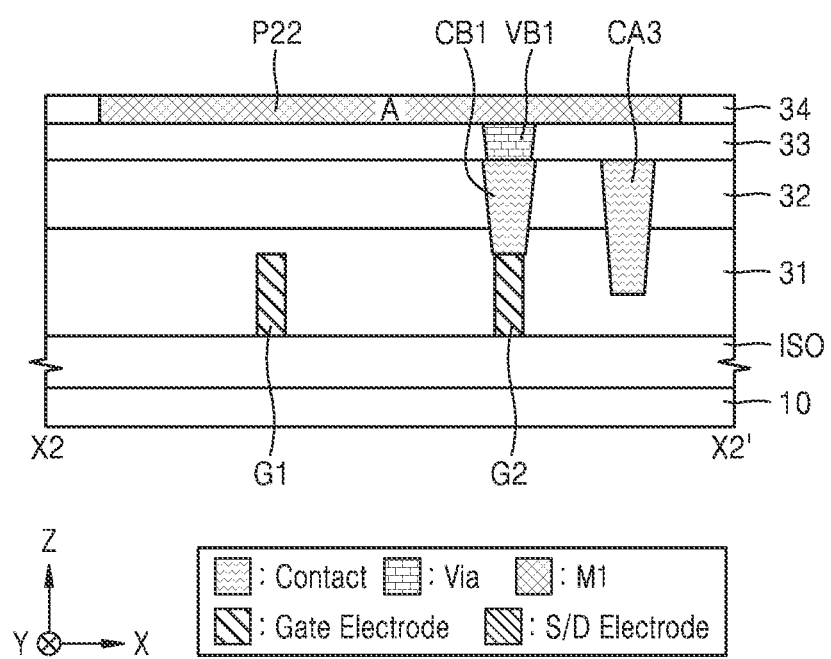
Figure 3C:
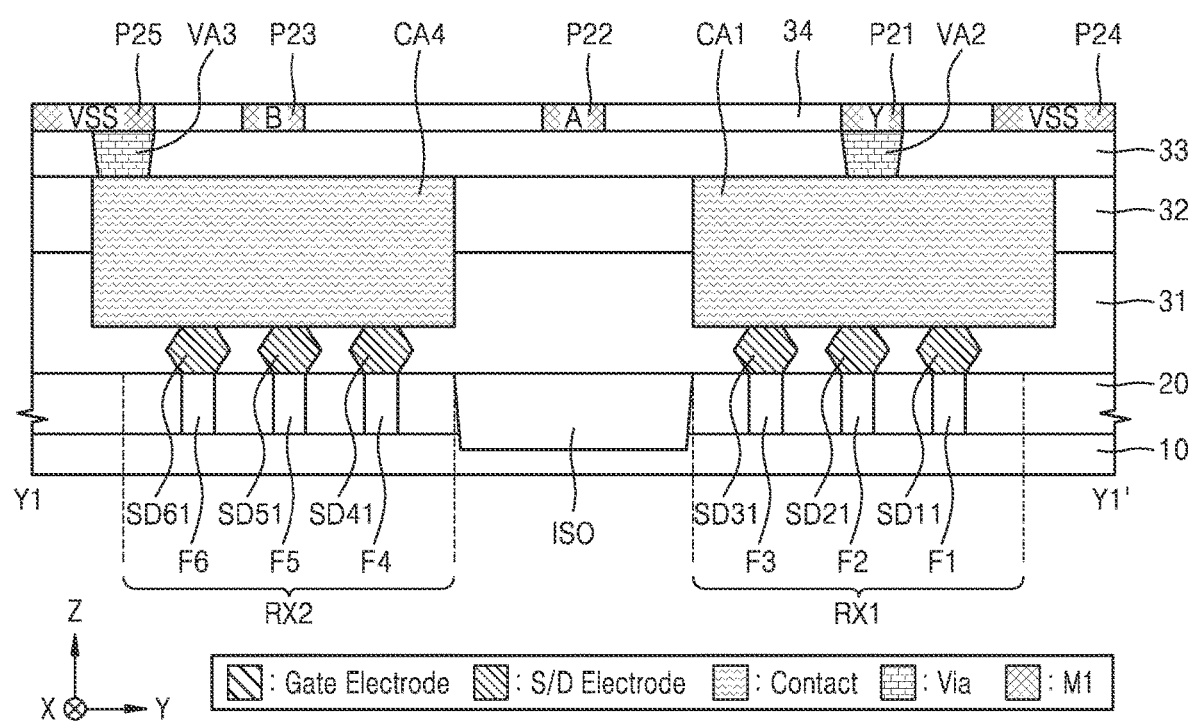
Figure 3D:
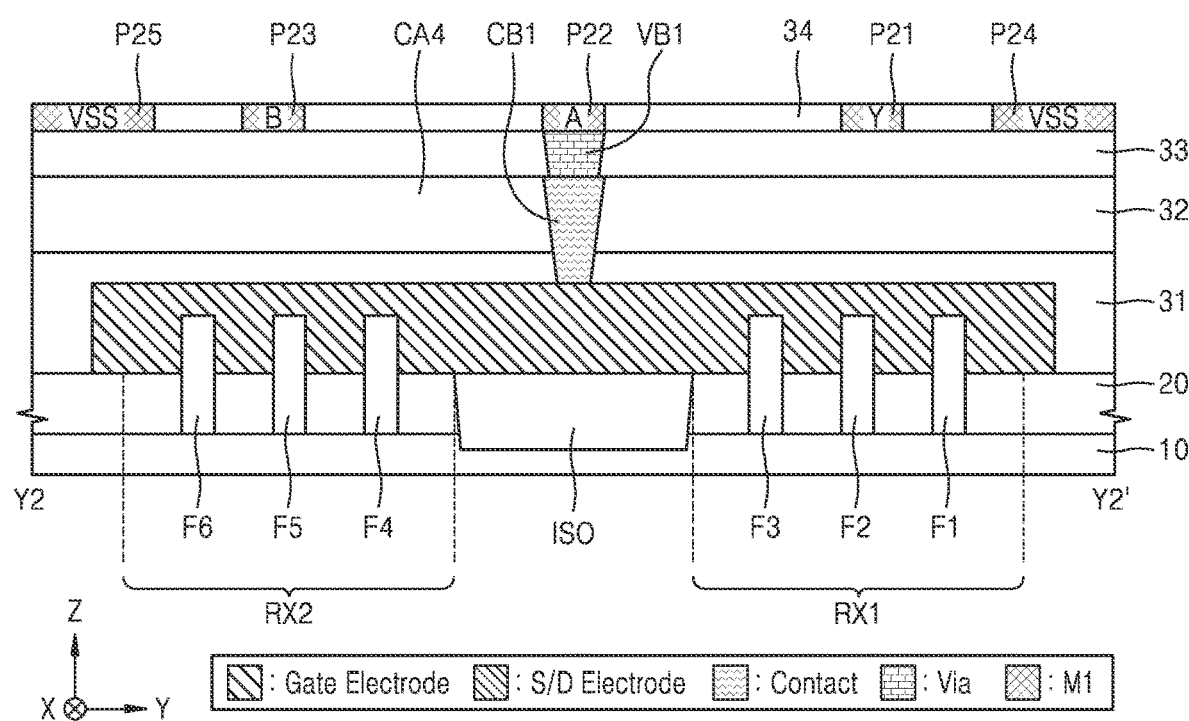

FIGS. 3A to 3D are cross-sectional views of structures of cells according to an example embodiment. Particularly, the cross-sectional view of FIG. 3A shows a cross-section of the first cell C11 taken along line X1-X1' of FIG. 1, the cross-sectional view of FIG. 3B shows a cross-section of the first cell C11 taken along line X2-X2' of FIG. 1, the cross-sectional view of FIG. 3C shows a cross-section of the first cell C11 taken along line Y1-Y1' of FIG. 1, and the cross-sectional view of FIG. 3D shows a cross-section of the first cell C11 taken along line Y2-Y2' of FIG. 1. A gate spacer may be formed on a side of a gate electrode, and a gate dielectric film may be formed between the gate electrode and the gate spacer and on a lower surface of the gate electrode. In addition, a barrier film may be formed on a surface of a contact and/or a via. Hereinafter, FIGS. 3A to 3D will be described with reference to FIG. 1, and repeated descriptions are not provided with reference to FIGS. 3A to 3D.

Referring to FIG. 3A, a substrate 10 may include bulk silicon or a silicon-on-insulator (SOI), and as a non-limited example, the substrate 10 may include silicon germanium (SiGe), silicon germanium on insulator (SGOI), indium antimonide (InSb), a lead telluride (PbTe) compound, indium arsenide (InAs), phosphide, gallium arsenide (GaAs), gallium antimonide (GaSb), or the like. A second fin F2 may extend on the substrate 10 in the X-axis direction, and first to third source/drain regions SD21 to SD23 may be formed on the second fin F2. First to fourth interlayer insulating layers 31 to 34 may be formed on the second fin F2. The first and second source/drain regions SD21 and SD22 may form a transistor, i.e., a p-type field effect transistor (PFET), with a first gate electrode G1, and the second and third source/drain regions SD22 and SD23 may form a PFET with a second gate electrode G2.

First to third source/drain contacts CA1 to CA3 may be connected to the first to third source/drain regions SD21 to SD23 by passing through the second interlayer insulating layer 32. In some embodiments, at least one of the first to third source/drain contacts CA1 to CA3 may be formed as a lower source/drain contact passing through the first interlayer insulating layer 31 and an upper source/drain contact passing through the second interlayer insulating layer 32. First and second source/drain vias VA1 and VA2 may be respectively connected to the first and third source/drain contacts CA1 and CA3 by passing through the third interlayer insulating layer 33, and commonly connected to an output pin P21 formed in the first wiring layer M1. Accordingly, the output pin P21 may be electrically connected to the first source/drain region SD21 through the first source/drain via VA1 and the first source/drain contact CA1 and electrically connected to the third source/drain region SD23 through the second source/drain via VA2 and the third source/drain contact CA3. A layer in which the first and second source/drain vias VA1 and VA2 are formed may be referred to as a first via layer, and a layer in which the output pin P21 and the fourth interlayer insulating layer 34 are formed may be referred to as the first wiring layer M1.

As shown in FIG. 3B, a device isolation layer ISO may be formed on the substrate 10. The device isolation layer ISO may isolate active regions from each other as described below with reference to FIGS. 3C and 3D. The first to fourth interlayer insulating layers 31 to 34 may be formed on the device isolation layer ISO, and the third source/drain contact CA3 may pass through the second interlayer insulating layer 32. A first gate contact CB1 may be connected to the second gate electrode G2 by passing through the second interlayer insulating layer 32, and a first gate via VB1 may be connected to the first gate contact CB1 and a first input pin P22 by passing through the third interlayer insulating layer 33. Accordingly, the first input pin P22 may be electrically connected to the second gate electrode G2 through the first gate via VB1 and the first gate contact CB1. In some embodiments, unlike as shown in FIG. 3B, the first gate contact CB1 may be omitted, and the first input pin P22 may be electrically connected to the second gate electrode G2 through a gate via passing through both the second and third interlayer insulating layers 32 and 33.

Referring to FIG. 3C, a field insulating layer 20 may be formed on the substrate 10. The field insulating layer 20 may include, as a non-limited example, silicon dioxide ($SiO_2$), silicon nitride (SiN), silicon oxynitride (SiON), silicon oxycarbonitride (SiOCN), or a combination of two or more thereof. In some embodiments, the field insulating layer 20 may encompass some of side surfaces of an active pattern, i.e., a fin, as shown in FIG. 3C. The first to fourth interlayer insulating layers 31 to 34 may be formed on the field insulating layer 20. First to sixth fins F1 to F6 may extend in the X-axis direction on the field insulating layer 20, and six source/drain regions SD11 to SD61 may be formed on the first to sixth fins F1 to F6, respectively. The device isolation layer ISO may extend, in the X-axis direction, between the third fin F3 and the fourth fin F4, and first and second active regions RX1 and RX2 may be isolated from each other by the device isolation layer ISO.

The first source/drain contact CA1 may be connected to the three source/drain regions SD11, SD21, and SD31 by passing through the second interlayer insulating layer 32, and accordingly, the three source/drain regions SD11, SD21, and SD31 may be electrically connected to each other. In addition, a fourth source/drain contact CA4 may be connected to the three source/drain regions SD41, SD51, and SD61 by passing through the second interlayer insulating layer 32, and accordingly, the three source/drain regions SD41, SD51, and SD61 may be electrically connected to each other. The second source/drain via VA2 may be connected to the first source/drain contact CA1 by passing through the third interlayer insulating layer 33, and connected to the output pin P21. In addition, a third source/drain via VA3 may be connected to the fourth source/drain contact CA4 by passing through the third interlayer insulating layer 33, and connected to a pattern P25, which is formed in the first wiring layer M1, and to which the negative supply voltage (or the ground potential) VSS is applied. In the first wiring layer M1, a pattern P24 to which the positive supply voltage VDD is applied and the pattern P25 to which the negative supply voltage VSS is applied may extend in parallel to each other in the X-axis direction, and the output pin P21, the first input pin P22, and a second input pin P23 may be formed in the first wiring layer M1.

Referring to FIG. 3D, the field insulating layer 20 may be formed on the substrate 10, and the first to sixth fins F1 to F6 passing through the field insulating layer 20 may intersect with the second gate electrode G2 extending in the Y-axis direction. The second gate electrode G2 may include, as a non-limited example, titanium (Ti), tantalum (Ta), tungsten (W), aluminum (Al), cobalt (Co), or a combination of two or more thereof, or include a non-metal such as Si or SiGe. In addition, the second gate electrode G2 may be formed by stacking two or more conductive materials, e.g., titanium nitride (TiN), tantalum nitride (TaN), titanium carbide (TiC), tantalum carbide (TaC), titanium aluminum carbide (TialC), or a work function control layer including a combination of two or more thereof, and a filling conductive layer including W, Al, or the like.

Figure 4:
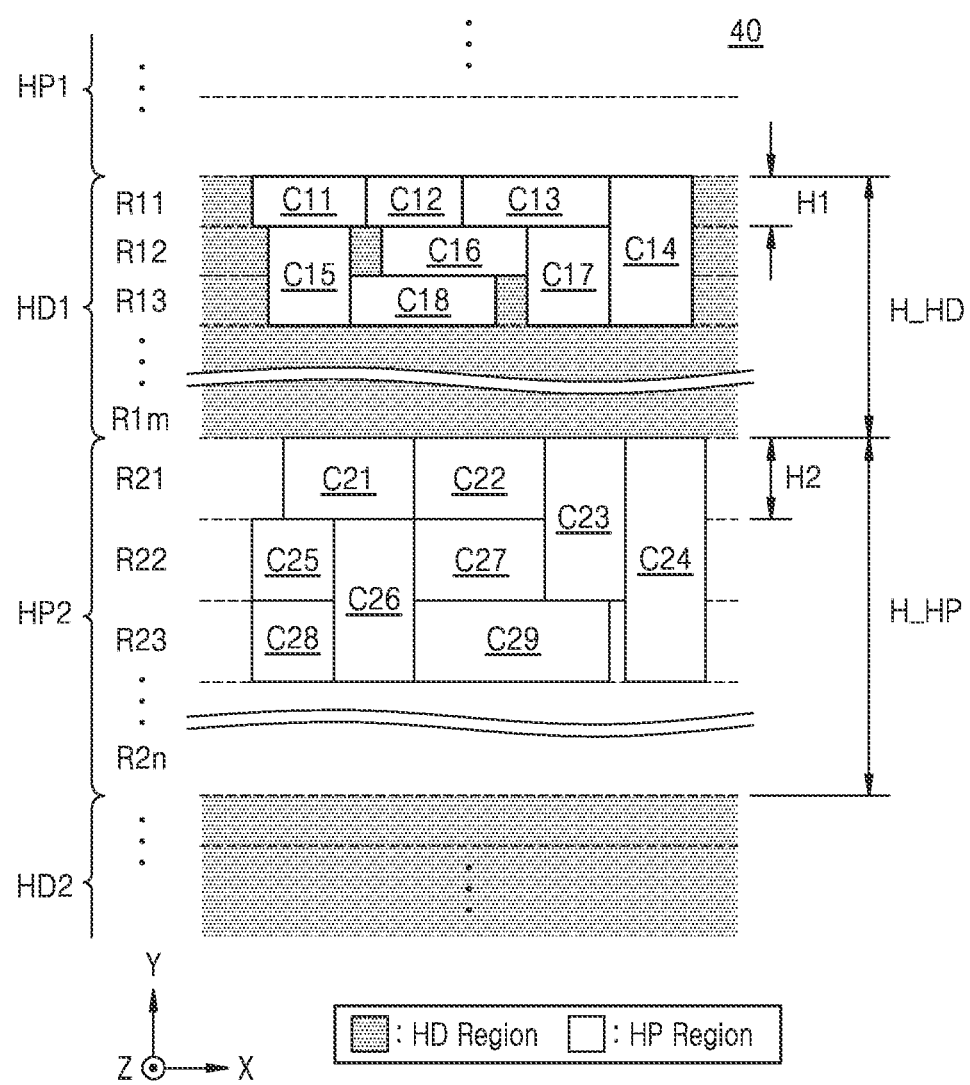
FIG. 4 is a top view of a layout of an IC according to an embodiment.

FIG. 4 is a top view of a layout of an IC 40 according to an example embodiment. Particularly, the top view of FIG. 4 schematically shows some of cells included in the IC 40.

HD regions and HP regions may be alternately placed. For example, as shown in FIG. 4, a first HD region HD1 may be between first and second HP regions HP1 and HP2, and the second HP region HP2 may be between the first HD region HD1 and a second HD region HD2. An HD row within an HD region may have the first height H1, and a height H_HD of the entire first HD region HD1 corresponding to a series of HD rows R11 to R1m may correspond to a total height of m HD rows R11 to R1m (H_HD=m*H1, m is an integer greater than 1). In addition, an HP row within an HP region may have the second height H2, the second height H2 being greater than the first height H1 (H2>H1), and a height H_HP of the entire second HP region HP2 corresponding to a series of HP rows R21 to R2n may correspond to a total height of n HP rows R21 to R2n (H_HP=n*H2, n is an integer greater than 1). Hereinafter, it is assumed that HD regions have a certain height H_HD referred to as an HD region height and HP regions have a certain height H_HP referred to as an HP region height, but, in some embodiments, two or more HD regions may have different heights, respectively, and two or more HP regions may also have different heights, respectively. In addition, it is assumed that an HD cell has the first height H1 and an HP cell has the second height H2, the second height H2 being greater than the first height H1.

The IC 40 may include a plurality of HD cells C11 to C18 placed in the first HD region HD1, and the plurality of HD cells C11 to C18 may include single height HD cells C11, C12, C13, C16, and C18 and multi-height HD cells C14, C15, and C17. In some embodiments, the height H_HD (i.e., m*H1) of the first HD region HD1 may be determined based on the HD cells C11 to C18 placed in the first HD region HD1. For example, the height H_HD of the first HD region HD1 may be determined based on a height of a multi-height HD cell having the greatest height (may be referred to as a first multi-height cell), e.g., the HD cell C14 in FIG. 4, among the HD cells C11 to C18 placed in the first HD region HD1. In addition, the IC 40 may include a plurality of HP cells C21 to C29 placed in the second HP region HP2, and the plurality of HP cells C21 to C29 may include single height HP cells C21, C22, C25, C27, C28, and C29 and multi-height HP cells C23, C24, and C26. In some embodiments, the height H_HP (i.e., n*H2) of the second HP region HP2 may be determined based on the HP cells C21 to C29 placed in the second HP region HP2. For example, the height H_HP of the second HP region HP2 may be determined based on a height of a multi-height HP cell having the greatest height (may be referred to as a second multi-height cell), e.g., the HP cell C24 in FIG. 4, among the HP cells C21 to C29 placed in the second HP region HP2.

Figure 5A:
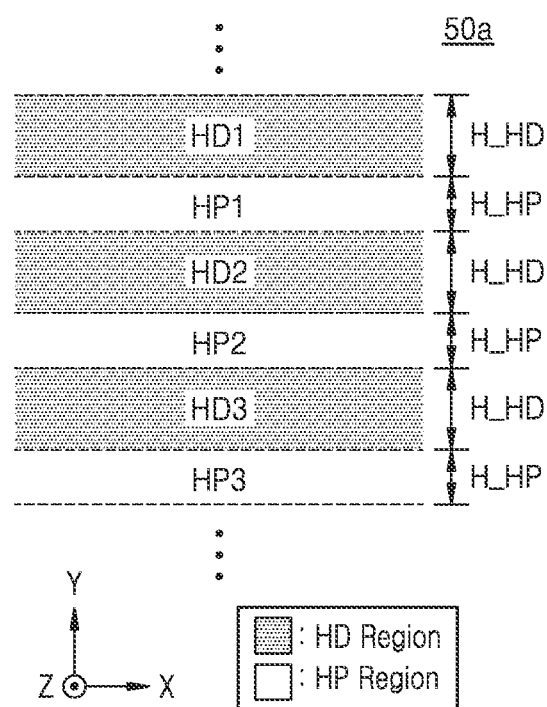
FIGS. 5A and 5B are top views of layouts of ICs according to embodiments.
Figure 5B:
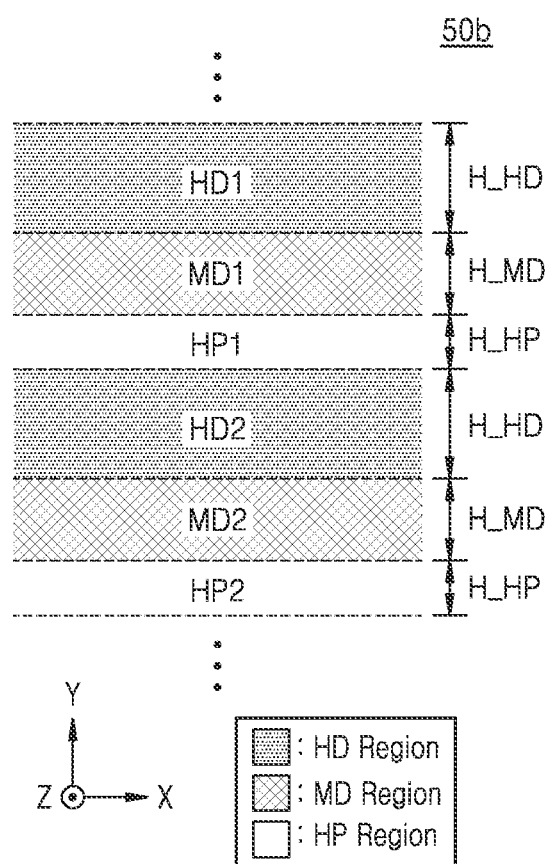

FIGS. 5A and 5B are top views of layouts of ICs according to example embodiments. Particularly, the top view of FIG. 5A shows a layout of an IC 50a including cells placed in rows having either one of two different heights, and the top view of FIG. 5B shows a layout of an IC 50b including cells placed in rows having any one of three different heights. Hereinafter, repeated descriptions are not provided with reference to FIGS. 5A and 5B.

Referring to FIG. 5A, the IC 50a may include alternately placed HD regions and HP regions. For example, as shown in FIG. 5A, the IC 50a may include first to third HD regions HD1 to HD3 each having the HD region height H_HD and include first to third HP regions HP1 to HP3 each having the HP region height H_HP, wherein the first to third HD regions HD1 to HD3 and the first to third HP regions HP1 to HP3 may be alternately placed. As described above with reference to FIG. 4 and the like, HD cells having the first height H1 may be placed in the first to third HD regions HD1 to HD3, and HP cells having the second height H2, the second height H2 being greater than the first height H1, may be placed in the first to third HP regions HP1 to HP3.

Referring to FIG. 5B, the IC 50b may include not only alternately placed HD regions and HP regions but also middle density (MD) regions, wherein the HD regions, the MD regions, and the HP regions may be successively placed. For example, as shown in FIG. 5B, the IC 50b may include the first to second HD regions HD1 and HD2 each having the HD region height H_HD, include first and second MD regions MD1 and MD2 each having a height H_MD, and include the first and second HP regions HP1 and HP2 each having the HP region height H_HP. The IC 50b may include MD cells placed in the first and second MD regions. An MD cell may have a larger area and a higher performance than an HD cell and have a smaller area and a lower performance than an HP cell. To this end, the first and second MD regions may correspond to MD rows each having a height greater than the first height H1 and less than the second height H2.

In some embodiments, unlike the ICs 50a and 50b of FIGS. 5A and 5B, an IC may include cells placed in rows having four different heights. Hereinafter, example embodiments will be described mainly with reference to an IC having alternately placed HD regions and HP regions like the IC 50a, but example embodiments are not limited thereto.

Figure 6:
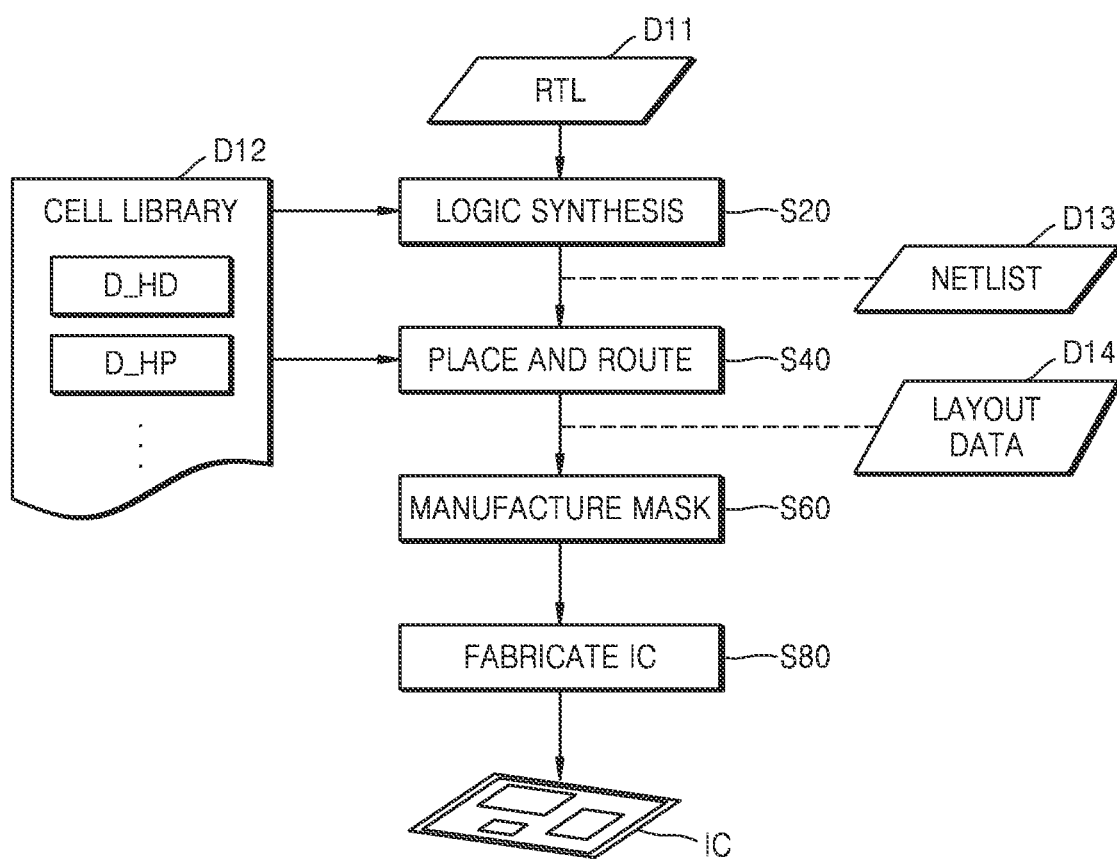
FIG. 6 is a flowchart of a method of fabricating an IC, according to an embodiment.

FIG. 6 is a flowchart of a method of fabricating an IC, according to an example embodiment. Particularly, the flowchart of FIG. 6 shows an example of a method of fabricating an IC including a mixed-row block. As shown in FIG. 6, the method of fabricating an IC may include a plurality of operations S20, S40, S60, and S80.

A cell library (or standard cell library) D12 may include information about cells, e.g., function information, characteristic information, and layout information. As shown in FIG. 6, the cell library D12 may include first data D_HD defining HD cells, and second data D_HP defining HP cells. For example, the first data D_HD may define HD cells with a height corresponding to a multiple of the first height H1, and the second data D_HP may define HP cells with a height corresponding to a multiple of the second height H2. For example, each HD cell may have a respective height corresponding to any integral multiple of the first height H1, and each HP cell may have a respective height corresponding to any integral multiple of the second height H2.

In operation S20, a logic synthesis operation of generating a netlist D13 from register transfer level (RTL) data D11 may be performed. For example, a semiconductor design tool (e.g., a logic synthesis tool) may generate the netlist D13 including a bitstream or a netlist by performing logic synthesis on the RTL data D11 with reference to the cell library D12, the RTL data D11 being created by a hardware description language (HDL) such as a very high-speed integrated circuit (VHSIC) hardware description language (VHDL) or Verilog. The semiconductor design tool may select an HD cell or an HP cell from the cell library D12 based on requirements of an IC. For example, the semiconductor design tool may select an HD cell instead of an HP cell providing the same function when timing of a signal path has a particular margin.

In operation S40, a place and route (P&R) operation of generating layout data D14 from the netlist D13 may be performed. For example, a semiconductor design tool (e.g., a P&R tool) may determine the number of HD regions in which HD cells are to be placed, the number of HD rows corresponding to the HD regions, the number of HP regions in which HP cells are to be placed, the number of HP rows corresponding to the HP regions, and the like for a floorplan of an IC. Thereafter, the semiconductor design tool may place the HD cells in the HD regions and place the HP cells in the HP regions, from the netlist D13 with reference to the cell library D12. The semiconductor design tool may generate interconnections electrically connecting output pins and input pins of the placed cells, and generate layout data D14 defining the placed cells and the generated interconnections. The layout data D14 may have a format, for example, graphic design system II (GDSII) and include geometric information of cells and interconnections. Operation S40 alone or both operations S20 and S40 may be referred to as a method of designing an IC, and an example of operation S40 will be described below with reference to FIG. 7.

In operation S60, an operation of manufacturing a mask may be performed. For example, optical proximity correction (OPC) for correcting a distortion phenomenon such as refraction caused by characteristics of light in photolithography may be applied to the layout data D14. Patterns on a mask may be defined to form patterns in a plurality of layers based on data to which OPC is applied, and at least one mask (or photomask) for forming the respective patterns of the plurality of layers may be manufactured. In some embodiments, a layout of an IC may be restrictively modified in operation S60, and the restrictively modifying of the IC in operation S60 is post-processing for optimizing a structure of the IC and may be referred to as design polishing.

In operation S80, an operation of fabricating an IC may be performed. For example, the IC may be fabricated by using the at least one mask, manufactured in operation S60, to pattern a plurality of layers. A front-end-of-line (FEOL) process may include planarizing and cleaning a wafer, forming a trench, forming a well, forming a gate electrode, and forming a source and a drain, and individual devices, e.g., transistors, capacitors, and resistors may be formed on a substrate by the FEOL process. In addition, a back-end-of-line (BEOL) process may include siliciding gate, source, and drain regions, adding a dielectric, performing planarization, forming a hole, adding a metal layer, forming a via, forming a passivation layer, and the like, and individual devices, e.g., transistors, capacitors, and resistors, may be interconnected by the BEOL process. In some embodiments, a middle-of line (MOL) process may be performed between the FEOL process and the BEOL process, and contacts may be formed on individual devices during the MOL process. Thereafter, the IC may be packaged in a semiconductor package and used as a component of various applications.

Figure 7:
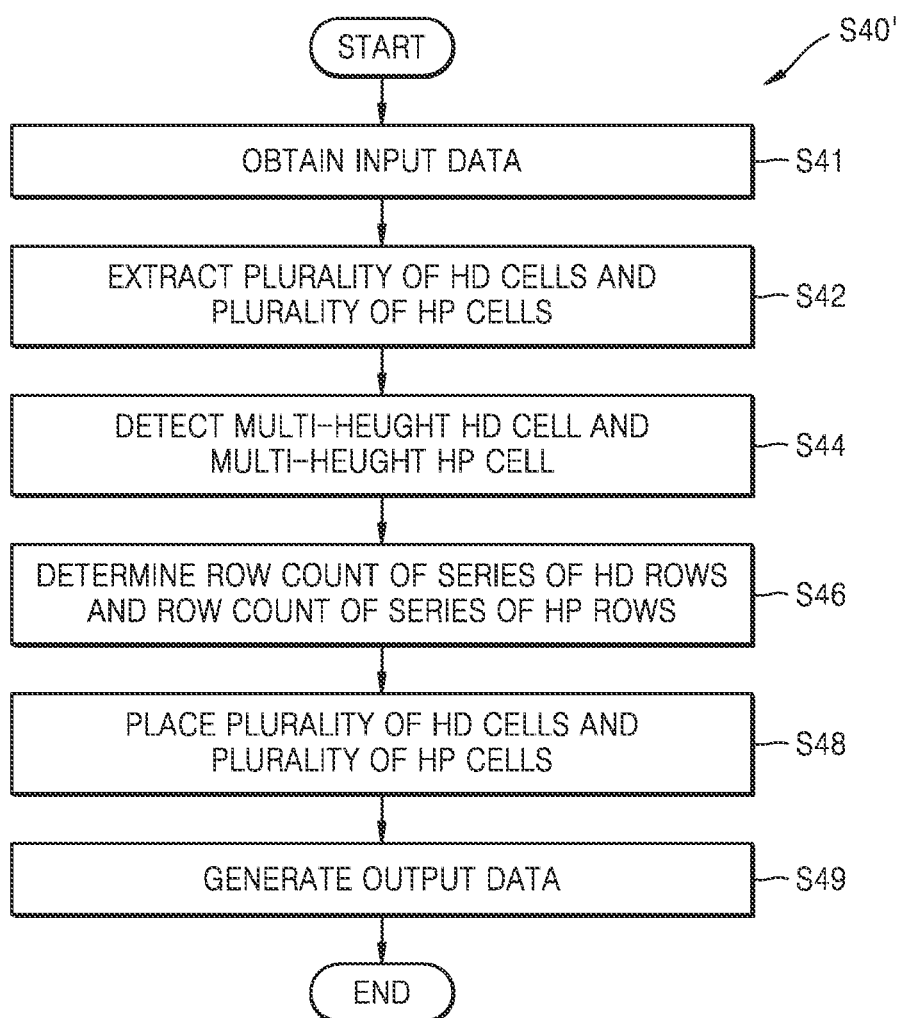
FIG. 7 is a flowchart of a method of designing an IC, according to an embodiment.

FIG. 7 is a flowchart of a method of designing an IC, according to an example embodiment. Particularly, the flowchart of FIG. 7 is an example of operation S40 of FIG. 6. As described above with reference to FIG. 6, in operation S40' of FIG. 7, P&R may be performed. As shown in FIG. 7, operation S40' may include a plurality of operations S41, S42, S44, S46, S48, and S49, and hereinafter, FIG. 7 will be described with reference to FIG. 6.

Referring to FIG. 7, in operation S41, an operation of obtaining input data may be performed. The input data may include information about HD cells and HP cells. In some embodiments, the input data may be the cell library D12 of FIG. 6. The cell library D12 may define HD cells and HP cells which may be formed by a semiconductor process of fabricating an IC, and accordingly, HD regions and HP regions may depend on the semiconductor process. In some embodiments, the input data may be the netlist D13 of FIG. 6. The netlist D13 may define HD cells and HP cells actually included in an IC among the HD cells and HP cells defined by the cell library D12, and accordingly, HD regions and HP regions may depend on the IC.

In operation S42, an operation of extracting a plurality of HD cells and a plurality of HP cells may be performed. For example, the plurality of HD cells to be placed in the HD regions and the plurality of HP cells to be placed in the HP regions may be extracted from the input data obtained in operation S41.

In operation S44, an operation of detecting a multi-height HD cell and a multi-height HP cell may be performed. For example, the multi-height HD cell may be detected from among the plurality of HD cells extracted in operation S42, and the multi-height HP cell may be detected from among the plurality of HP cells extracted in operation S42. As described above with reference to FIG. 4, the multi-height HD cell may have a height that is an integral multiple of the first height H1, and the multi-height HP cell may have a height that is an integral multiple of the second height H2. An example of operation S44 will be described below with reference to FIG. 8.

In operation S46, an operation of determining the row count of a series of HD rows and the row count of a series of HP rows may be performed. The series of HD rows may indicate consecutively placed HD rows, and the series of HP rows may indicate consecutively placed HP rows. The row count of the series of HD rows may be determined based on the multi-height HD cell detected in operation S44, and the row count of the series of HP rows may be determined based on the multi-height HP cell detected in operation S44. Accordingly, the row count of the series of HD rows and the row count of the series of HP rows may be optimized based on the input data. An example of operation S46 will be described below with reference to FIGS. 10A and 10B.

In operation S48, an operation of placing the plurality of HD cells and the plurality of HP cells may be performed. For example, the plurality of HD cells may be placed in HD regions, and the HD regions may correspond to HD rows of the row count determined in operation S46, respectively. In addition, the plurality of HP cells may be placed in HP regions, and the HP regions may correspond to HP rows of the row count determined in operation S46, respectively.

In operation S49, an operation of generating output data may be performed. The output data may define the plurality of HD cells and the plurality of HP cells placed in operation S48. In some embodiments, between operations S48 and S49, an operation of routing the placed plurality of HD cells and the placed plurality of HP cells may be performed, and the output data may correspond to the layout data D14 of FIG. 6.

Figure 8:
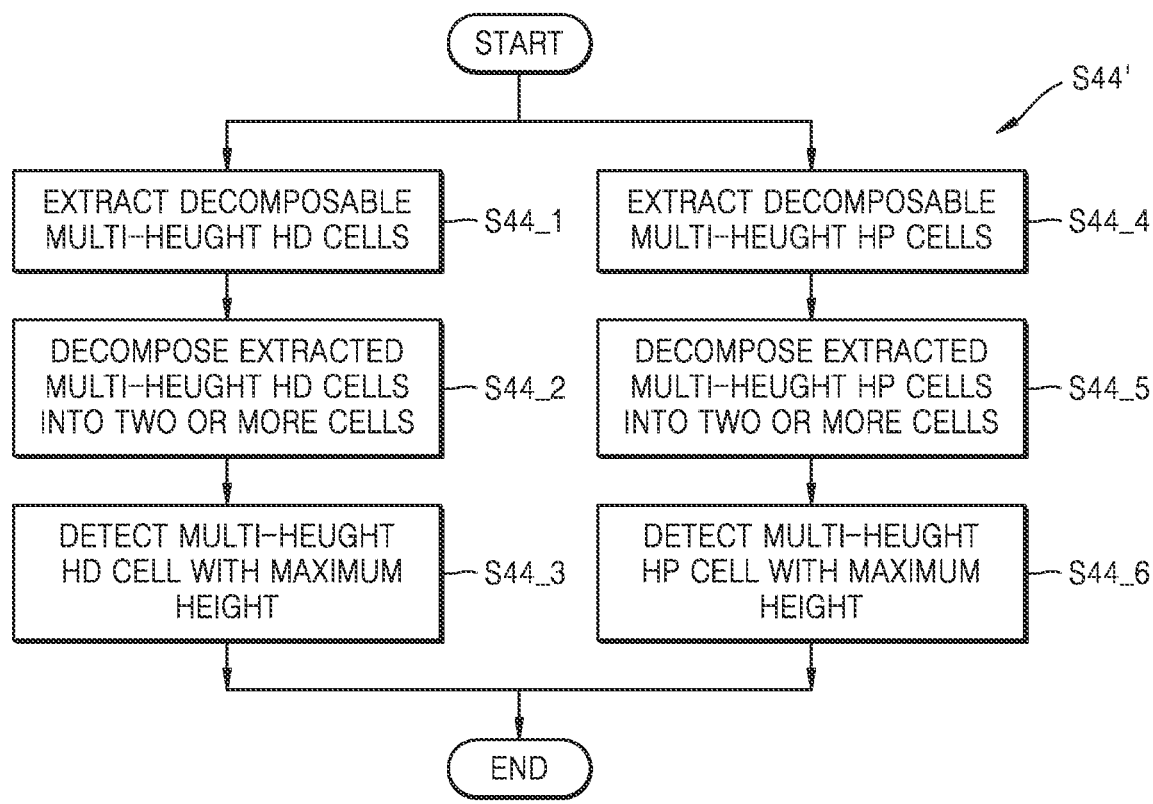
FIG. 8 is a flowchart of a method of designing an IC, according to an embodiment.

FIG. 8 is a flowchart of a method of designing an IC, according to an example embodiment. Particularly, the flowchart of FIG. 8 is an example of operation S44 of FIG. 7. As described above with reference to FIG. 7, in operation S44' of FIG. 8, an operation of detecting a multi-height HD cell and a multi-height HP cell may be performed. As shown in FIG. 8, operation S44' may include a plurality of operations S44_1 to S44_6, wherein a multi-height HD cell may be detected in operations S44_1, S44_2, and S44_3, and a multi-height HP cell may be detected in operations S44_4, S44_5, and S44_6. Hereinafter, FIG. 8 will be described with reference to FIG. 7.

Referring to FIG. 8, in operation S44_1, an operation of extracting decomposable multi-height HD cells may be performed. A decomposable cell may indicate a cell decomposable into two or more cells providing substantially the same function and performance. For example, a decomposable cell may include a multi-bit cell corresponding to a circuit configured to process a multi-bit signal as described below with reference to FIG. 9. Decomposable multi-height HD cells may be extracted from among a plurality of HD cells extracted from input data.

In operation S44_2, an operation of decomposing the extracted multi-height HD cells into two or more cells may be performed. Each of the two or more cells decomposed from the multi-height HD cells may itself be a multi-height HD cell or a single height HD cell. In some embodiments, the multi-height HD cells extracted in operation S44_1 may be decomposed into two or more cells, which cannot be decomposed any more, in operation S44_2. For example, a multi-bit cell configured to process a 16-bit signal may be decomposed into two multi-bit cells each configured to process an 8-bit signal, which cannot be decomposed any more.

In operation S44_3, an operation of detecting a multi-height HD cell with a maximum height may be performed. The plurality of HD cells extracted in operation S42 of FIG. 7 may be modified to single height HD cells and multi-height HD cells, which cannot be decomposed any more, in operations S44_1 and S44_2. That is, a maximum height of HD cells may be reduced by operations S44_1 and S44_2, and a multi-height HD cell having the reduced maximum height of HD cells may be detected as the multi-height HD cell in operation S44 of FIG. 7.

In some embodiments, operations S44_1 and S44_2 may be performed to obtain only an HD cell which has a maximum height and cannot be decomposed any more, instead of to extract and decompose all decomposable multi-height HD cells. For example, in operation S44_1, a multi-height HD cell with a maximum height may be extracted from among the decomposable multi-height HD cells, in operation S44_2, the extracted multi-height HD cell may be decomposed into two or more cells, and then operation S44_1 may be performed again on the decomposed two or more cells. When a multi-height HD cell extracted in operation S44_1 is identical to one of two or more cells decomposed in operation S44_2 previously performed, repetition of operations S44_1 and S44_2 may end, and in operation S44_3, this multi-height HD cell may be detected as a multi-height HD cell with a maximum height.

Similar to operations S44_1, S44_2, and S44_3, in operations S44_4, S44_5, and S44_6, a multi-height HP cell may be detected. For example, decomposable multi-height HP cells may be extracted in operation S44_4, the extracted multi-height HP cells may be decomposed into two or more cells in operation S44_5, and a multi-height HP cell with a maximum height may be detected in operation S44_6.

Figure 9:
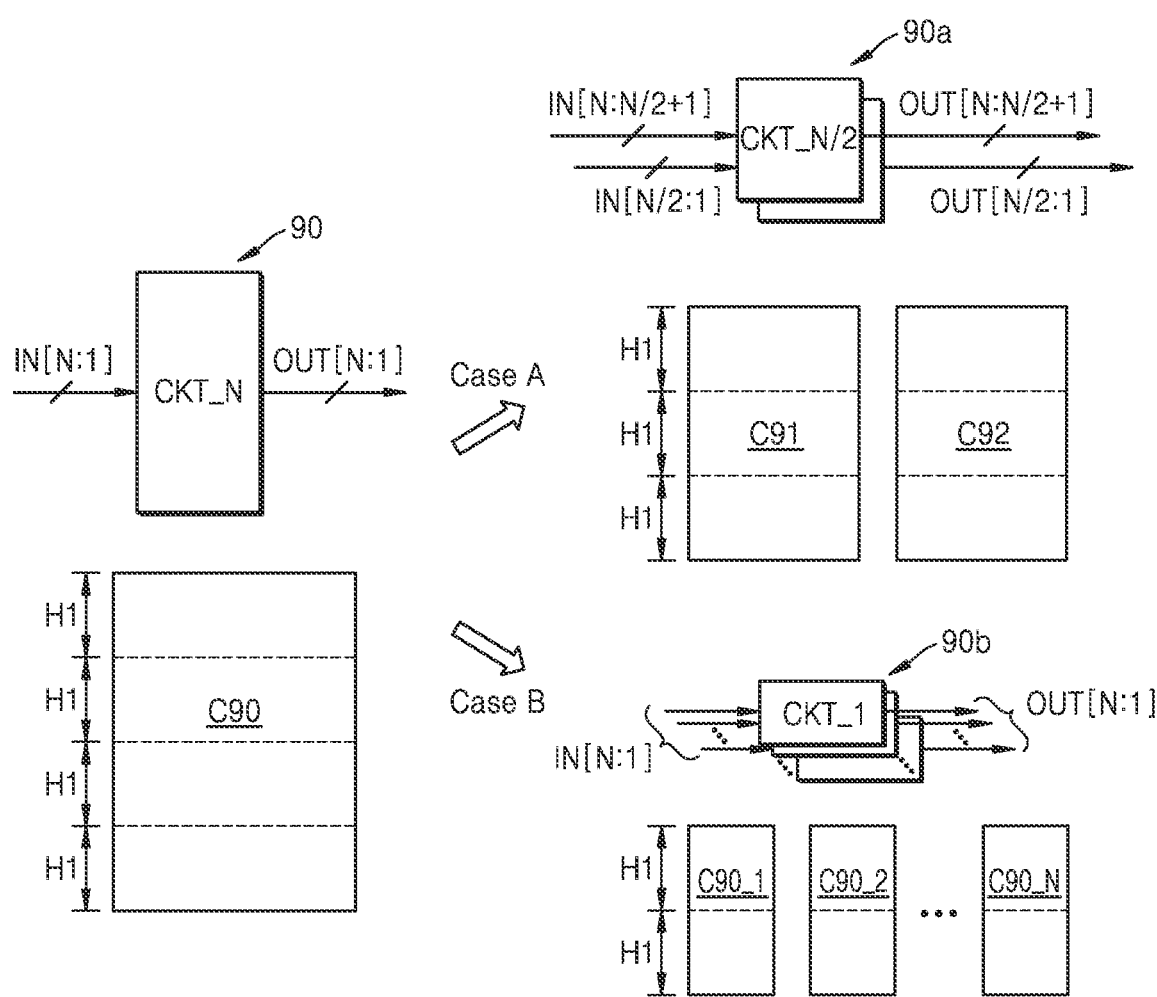
FIG. 9 is a view of a multi-height cell decomposed into two or more cells, according to an embodiment.

FIG. 9 is a view of a multi-height cell decomposed into two or more cells, according to an example embodiment. Particularly, FIG. 9 shows an example, in which a multi-height cell C90 is decomposed into two or more cells.

Referring to the left side of FIG. 9, the multi-height cell C90 may correspond to an N-bit processing circuit 90 configured to generate an N-bit output OUT[N:1] by processing an N-bit input IN[N:1]. The multi-height cell C90 may be placed in four consecutive HD rows, and have a height corresponding to 4*H1 as shown in FIG. 9.

Referring to the right side of FIG. 9, for a case A, the multi-height cell C90 may be decomposed into two multi-height cells C91 and C92. The two multi-height cells C91 and C92 may correspond to two N/2-bit processing circuits 90a, i.e., an N/2-bit processing circuit configured to generate an N/2-bit output OUT[N:N/2+1] by processing an N/2-bit input IN[N:N/2+1] and an N/2-bit processing circuit configured to generate an N/2-bit output OUT[N/2:1] by processing an N/2-bit input IN[N/2:1]. As shown in FIG. 9, the two multi-height cells C91 and C92 may each be placed in three consecutive HD rows and have a height corresponding to 3*H1.

Referring to the right side of FIG. 9, for a case B, the multi-height cell C90 may be decomposed into N multi-height cells C90_1, C90_2, . . . , C90_N. The N multi-height cells C90_1, C90_2, . . . , C90_N may collectively correspond to N single-bit processing circuits 90b each configured to generate one bit of an N-bit output OUT[N:1] by processing one bit of an N-bit input IN[N:1]. As shown in FIG. 9, the N multi-height cells C90_1, C90_2, . . . , C90_N may be placed in two consecutive HD rows and have a height corresponding to 2*H1.

Figure 10A:
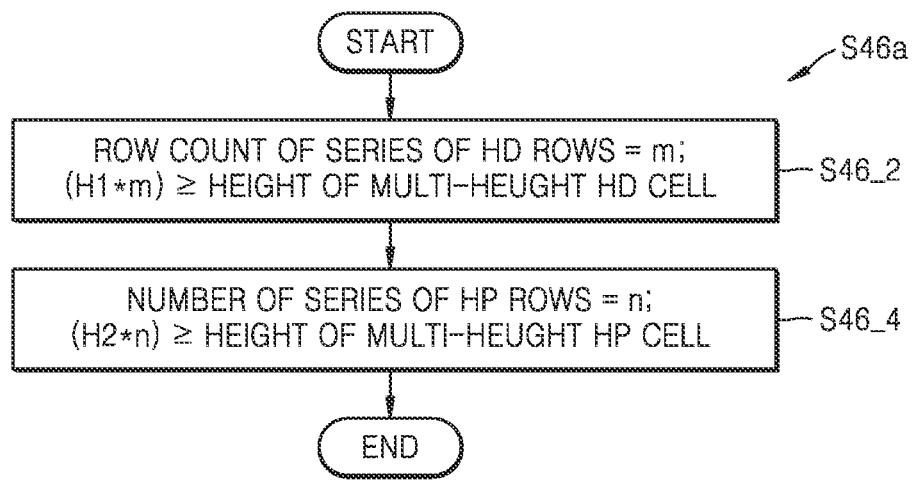
FIGS. 10A and 10B are flowcharts of a method of designing an IC, according to embodiments.
Figure 10B:
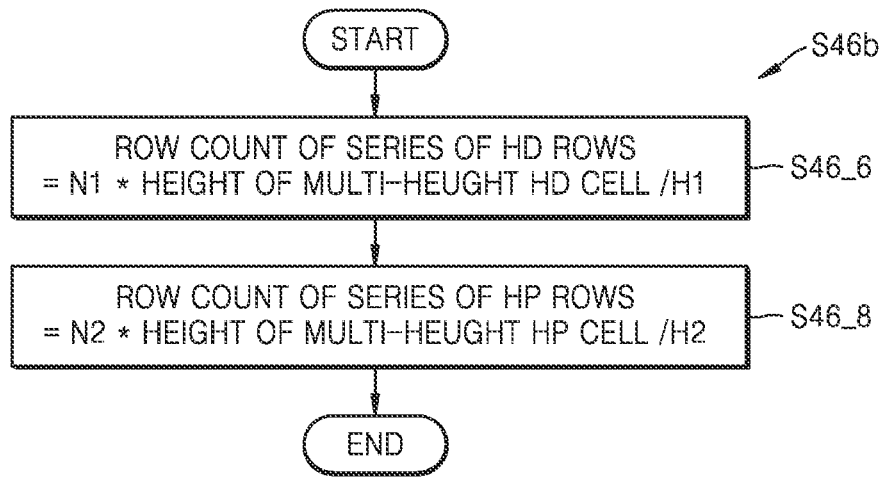

FIGS. 10A and 10B are flowcharts of a method of designing an IC, according to example embodiments. Particularly, the flowcharts of FIGS. 10A and 10B are examples of operation S46 of FIG. 7. As described above with reference to FIG. 7, in operation S46a of FIG. 10A and operation S46b of FIG. 10B, the row count of a series of HD rows and the row count of a series of HP rows may be determined. Hereinafter, FIGS. 10A and 10B will be described with reference to FIG. 7.

Referring to FIG. 10A, operation S46a may include operations S46_2 and S46_4. In operation S46_2, the row count of a series of HD rows may be determined so that a total height of the series of HD rows is greater than or equal to a height of the multi-height HD cell detected in operation S44 of FIG. 7. That is, the row count m of the series of HD rows may be determined so that a total height H1*m of the series of HD rows is greater than or equal to the height of the multi-height HD cell. When the row count of the series of HD rows is less than the height of the multi-height HD cell, the multi-height HD cell may be placed in another region different from that of the series of HD rows, i.e., a limited region, and as a result, the performance (e.g., signal delay) of an IC may vary. Similarly, in operation S46_4, the row count of a series of HP rows may be determined so that a total height of the series of HP rows is greater than or equal to a height of the multi-height HP cell detected in operation S44 of FIG. 7. That is, the row count n of the series of HP rows may be determined so that a total height H2*n of the series of HP rows is greater than or equal to the height of the multi-height HP cell.

Referring to FIG. 10B, operation S46b may include operations S46_6 and S46_8. In operation S46_6, the row count of a series of HD rows may be determined so as to correspond to a multiple of a height of the multi-height HD cell detected in operation S44 of FIG. 7. That is, the row count of the series of HD rows may correspond to a multiple of a value obtained by dividing the row count of rows occupied by the multi-height HD cell, i.e., the height of the multi-height HD cell, by the first height H1 (in FIG. 10B, N1 is an integer greater than 0). Accordingly, the multi-height HD cell may be placed in HD rows including an outer HD row (e.g., R11 of FIG. 4) among the series of HD rows, thereby achieving a high level of freedom in placement of the multi-height HD cell. For example, the height of the series of HD rows may be equal to an integer multiple (N1) of the ratio of the height of the multi-height cell to the first height H1. Similarly, in operation S46_8, the row count of a series of HP rows may be determined so as to correspond to a multiple of a height of the multi-height HP cell detected in operation S44 of FIG. 7. That is, the row count of the series of HP rows may correspond to a multiple of a value obtained by dividing the number of rows occupied by the multi-height HP cell, i.e., the height of the multi-height HP cell, by the second height H2 (in FIG. 10B, N2 is an integer greater than 0).

Figure 11:
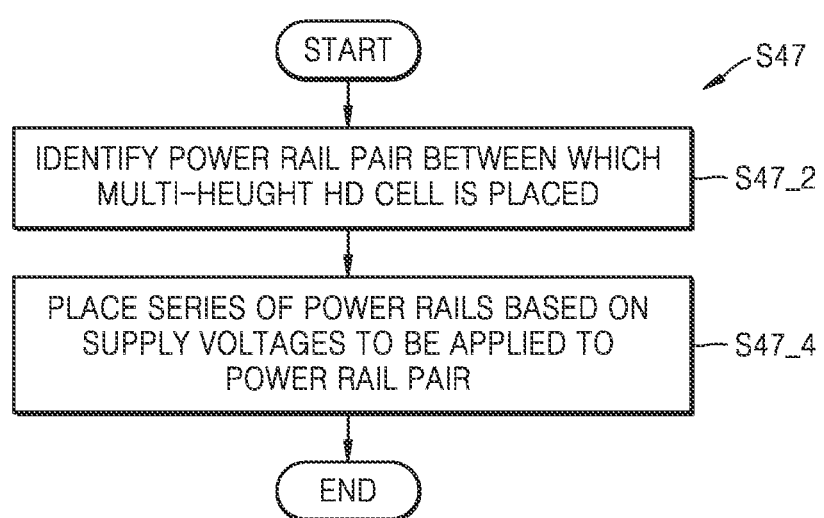
FIG. 11 is a flowchart of a method of designing an IC, according to an embodiment.
Figure 12A:
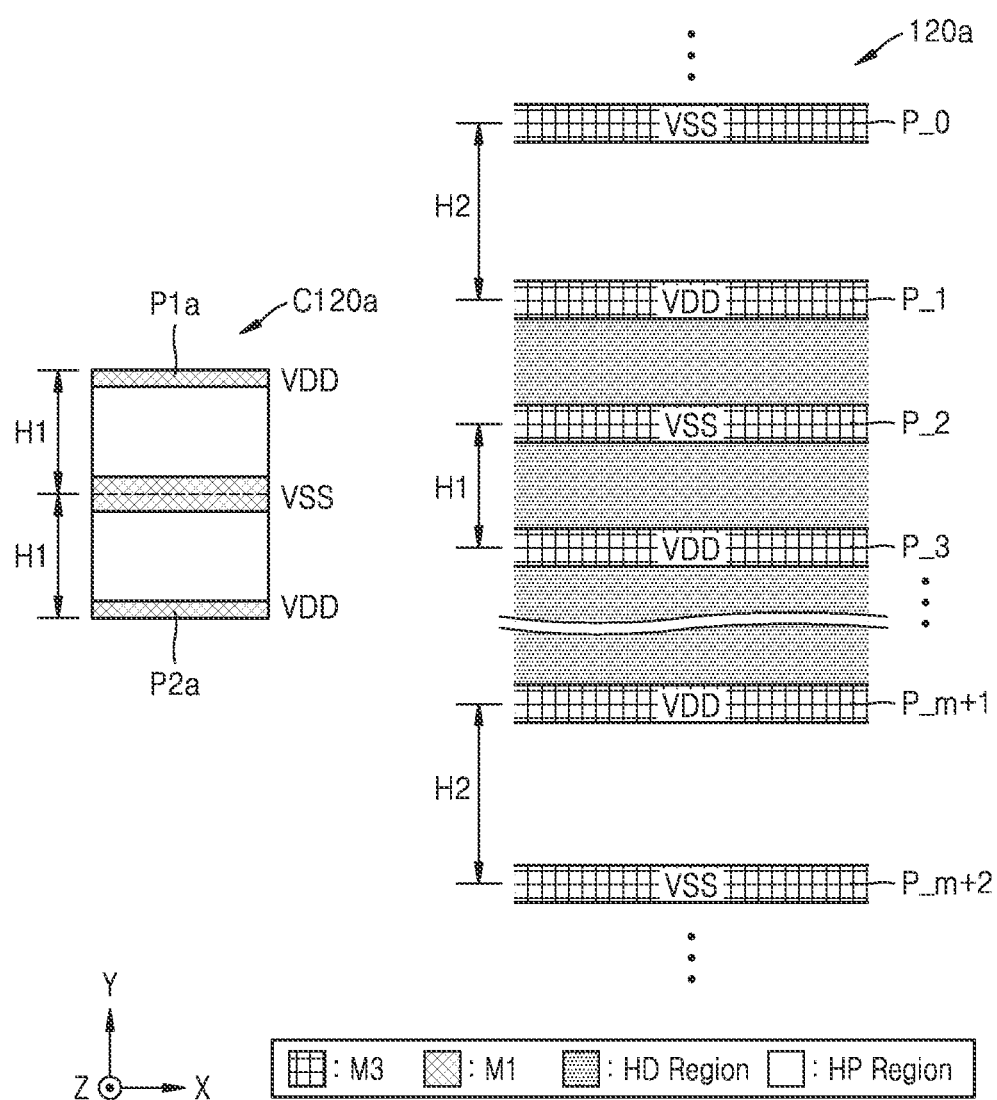
FIGS. 12A and 12B are top views of layouts of ICs according to embodiments.
Figure 12B:
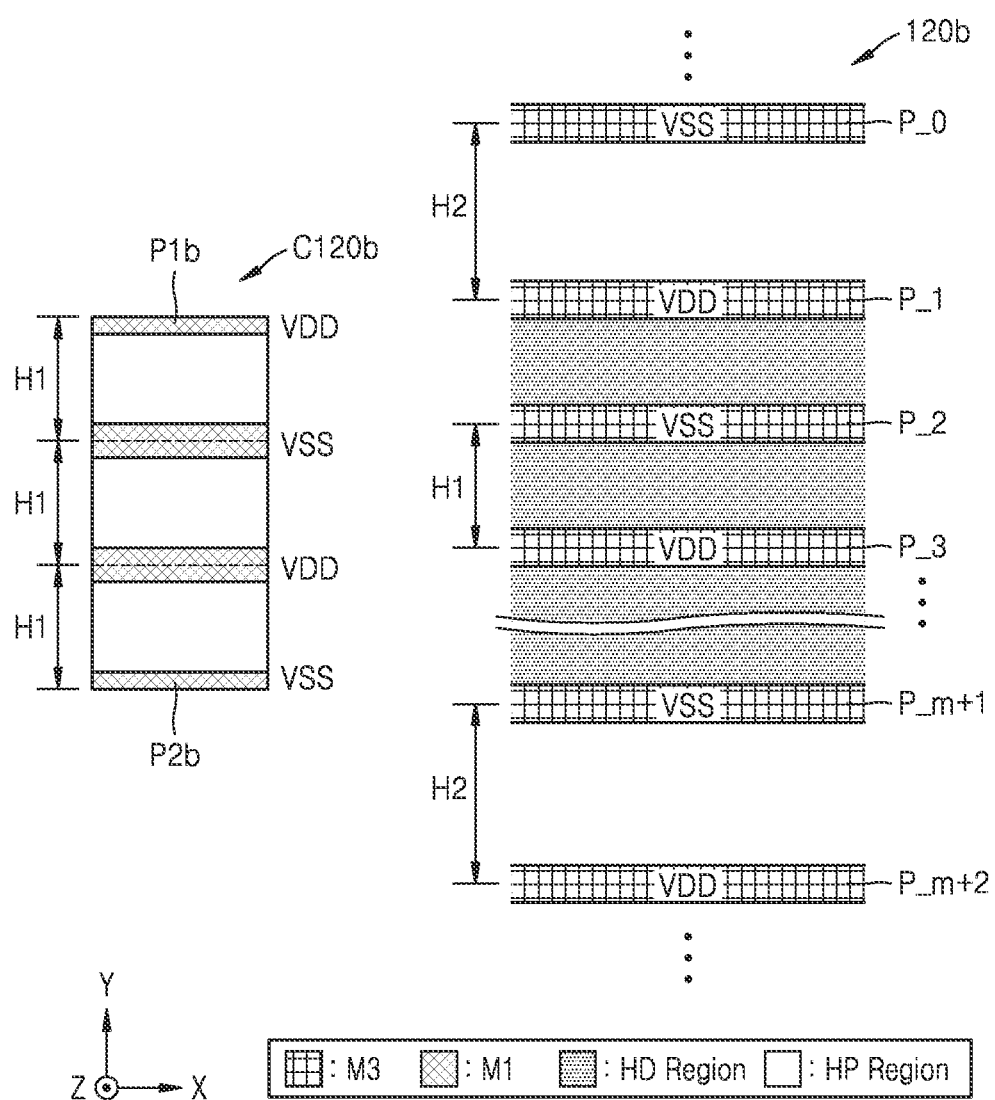

FIG. 11 is a flowchart of a method of designing an IC, according to an example embodiment, and FIGS. 12A and 12B are top views of layouts of ICs according to example embodiments. Particularly, the flowchart of FIG. 11 shows operation S47 of placing power rails for supplying power to HD cells (i.e., HD power rails), and the top views of FIGS. 12A and 12B respectively show ICs 120a and 120b including the power rails placed in operation S47 of FIG. 11. It will be understood that power rails for supplying power to HP cells (i.e., HP power rails) may be placed similarly to operation S47 of FIG. 11. In some embodiments, operation S47 of FIG. 11 may be performed between operations S46 and S48 of FIG. 7. Hereinafter, FIGS. 11, 12A, and 12B will be described with reference to FIG. 7, and repeated descriptions are not provided with reference to FIGS. 12A and 12B.

Referring to FIG. 11, operation S47 may include operations S47_2 and S47_4. In operation S47_2, an operation of identifying a power rail pair between which a multi-height HD cell is placed may be performed. Cells included in an IC may receive the positive supply voltage VDD and the negative supply voltage VSS from power rails extending in parallel to the X-axis in boundaries of rows. For example, as shown in FIG. 12A, the IC 120a may include patterns P_0 to P_m+2 extending in a third wiring layer M3 above the first wiring layer M1 in parallel to each other in the X-axis direction, and the patterns P_0 to P_m+2 may form some of power rails. The positive supply voltage VDD or the negative supply voltage VSS may be applied to each of the patterns P_0 to P_m+2, and as shown in FIG. 12A, the positive supply voltage VDD and the negative supply voltage VSS may be alternately applied to the patterns P_0 to P_m+2.

Referring to FIG. 12A, each of the patterns P_0 to P_m+2 may supply power to cells adjacent thereto, and the patterns P_1 and P_m+1 extending in the X-axis direction in a boundary of an HD region may supply power to both HD cells and HP cells. Patterns (e.g., P_2 and P_3) placed in the HD region may extend in the X-axis direction with a first pitch corresponding to the first height H1, whereas patterns (e.g., P_m+1 and P_m+2) placed in an HP region may extend in the X-axis direction with a second pitch corresponding to the second height H2. Similarly, referring to FIG. 12B, each of the patterns P_0 to P_m+2 may supply power to cells adjacent thereto, and the patterns P_1 and P_m+1 extending in the X-axis direction in a boundary of the HD region may supply power to both HD cells and HP cells. Patterns (e.g., P_2 and P_3) placed in the HD region may extend in the X-axis direction with the first pitch corresponding to the first height H1, whereas patterns (e.g., P_m+1 and P_m+2) placed in the HP region may extend in the X-axis direction with the second pitch corresponding to the second height H2.

Cells included in an IC may include patterns, which interface with boundaries facing each other in the Y-axis direction, and to each of which the positive supply voltage VDD or the negative supply voltage VSS is applied, and the patterns may form some of power rails. For example, as shown in FIG. 12A, a multi-height HD cell C120a may include first and second patterns P1a and P2a, which interface with boundaries facing each other in the Y-axis direction in the first wiring layer M1, and to which the positive supply voltage VDD is applied, and the first and second patterns P1a and P2a may form some of power rails. In addition, as shown in FIG. 12A, the multi-height HD cell C120a may further include a pattern, which extends in the X-axis direction in the first wiring layer M1, and to which the negative supply voltage VSS is applied. The first and second patterns P1a and P2a of the multi-height HD cell C120a may be placed below patterns of the third wiring layer M3 to which the positive supply voltage VDD is applied. In operation S47_2 of FIG. 11, a power rail pair between which the multi-height HD cell C120a of FIG. 12A is placed may be identified as two power rails to which the positive supply voltage VDD is applied, whereas a power rail pair between which a multi-height HD cell C120b of FIG. 12B is placed may be identified as two power rails to which the positive supply voltage VDD and the negative supply voltage VSS are respectively applied.

Referring back to FIG. 11, in operation S47_4, a series of HD power rails is placed based on supply voltages to be applied to the power rail pair. For example, as shown in FIG. 12A, supply voltages applied to a power rail pair of the multi-height HD cell C120a, i.e., the positive supply voltage VDD, may be applied to each of the patterns P_1 and P_m+1 extending along a boundary of the HD region in the third wiring layer M3. Accordingly, the multi-height HD cell C120a may be placed in the HD region by overlapping the pattern P_1 or P_m+1, and as a result, a high level of freedom in placement of the multi-height HD cell C120a in the IC 120a may be achieved. In addition, as shown in FIG. 12B, supply voltages applied to a power rail pair of the multi-height HD cell C120b, i.e., the positive supply voltage VDD and the negative supply voltage VSS, may be respectively applied to the patterns P_1 and P_m+1 extending along a boundary of the HD region in the third wiring layer M3. Accordingly, the multi-height HD cell C120*b* may be placed in the HD region by overlapping the pattern P_1 or P_m+1, and as a result, a high level of freedom in placement of the multi-height HD cell C120*b* in the IC 120*b* may be achieved.

Figure 13:
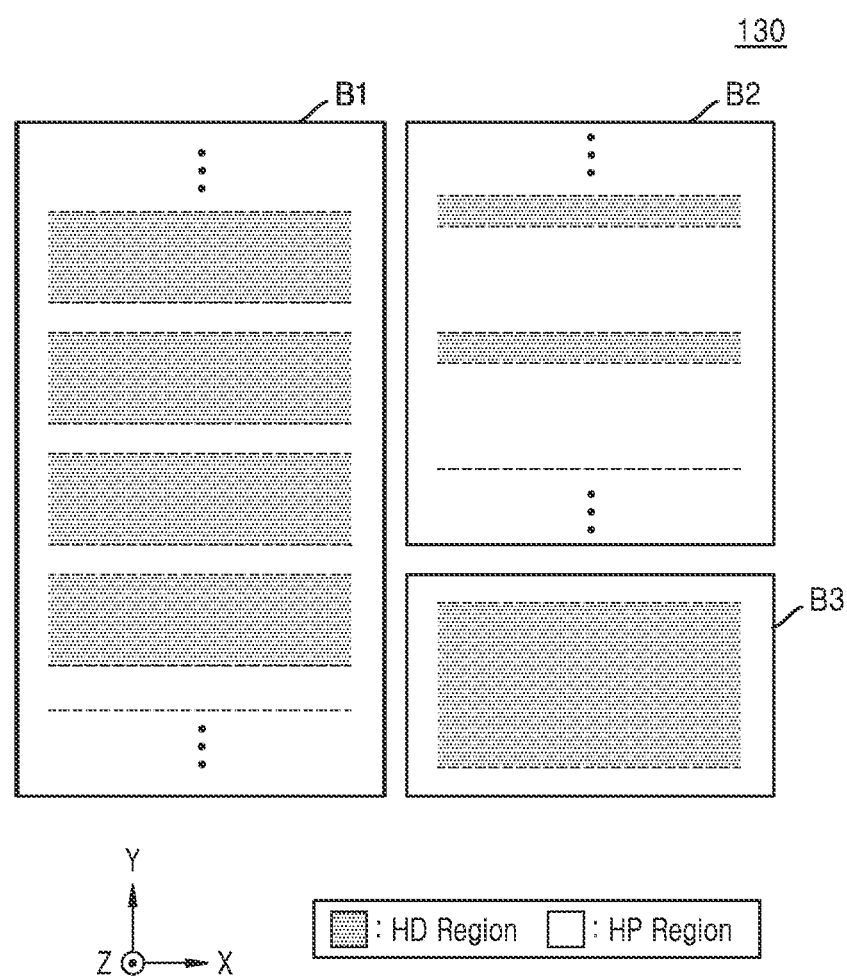
FIG. 13 is a top view of a layout of an IC according to an embodiment.

FIG. 13 is a top view of a layout of an IC according to an example embodiment. Particularly, the top view of FIG. 13 schematically shows a layout of an IC 130 including a plurality of blocks.

Referring to FIG. 13, the IC 130 may include first to third blocks B1 to B3. A block may indicate a unit of layout independently designed and formed. For example, the IC 130 may perform various functions, and each of the first to third blocks B1 to B3 may be designed to perform at least one of the various functions. In some embodiments, each of the first to third blocks B1 to B3 may be formed from an independent netlist, and dynamic voltage frequency scaling (DVFS) may be independently applied thereto.

The first to third blocks B1 to B3 may have different row configurations as shown in FIG. 13. For example, the first to third blocks B1 to B3 may be designed by referring to a common cell library defining a plurality of HD cells and a plurality of HP cells, but an HD region in which the HD cells are placed and an HP region in which the HP cells are placed may be differently defined in each of the first to third blocks B1 to B3. As shown in FIG. 13, the first and second blocks B1 and B2 may be mixed-row blocks, and the third block B3 may be an HD block. The first block B1 may include an HD region greater in height than an HP region, and the second block B2 may include an HP region greater in height than an HD region. Accordingly, the row count of a series of HD rows (or the row count of a series of HP rows) in the first block B1 may differ from the row count of a series of HD rows (or the row count of a series of HP rows) in the second block B2. Each of the first to third blocks B1 to B3 may include HD cells and HP cells respectively placed in an HD region and an HP region defined as described above with reference to the drawings, and accordingly, the IC 130 may provide an optimized area and performance.

Figure 14:
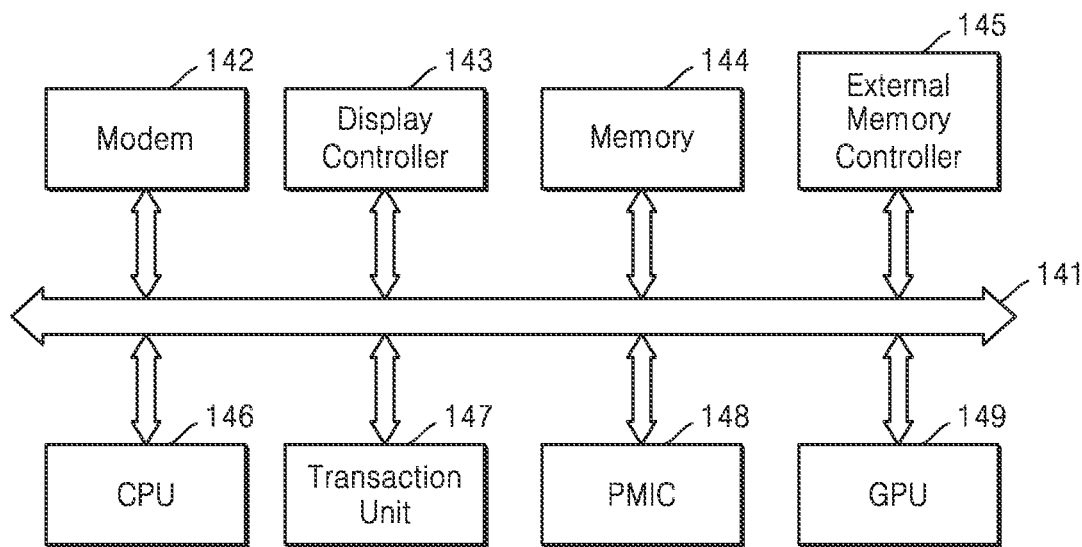
FIG. 14 is a block diagram of a system on chip (SoC) according to an embodiment.

FIG. 14 is a block diagram of a system on chip (SoC) 140 according to an example embodiment. The SoC 140 is a semiconductor device and may include an IC according to an example embodiment. The SoC 140 is obtained by implementing, in a single chip, complicated functional blocks, such as an intellectual property (IP) block, for performing various functions, and the SoC 140 may be designed by the method of designing an IC, according to example embodiments, and accordingly, the SoC 140 for providing an optimized area and performance may be achieved. Referring to FIG. 14, the SoC 140 may include a modem 142, a display controller 143, a memory 144, an external memory controller 145, a central processing unit (CPU) 146, a transaction unit 147, a power management integrated circuit (PMIC) 148, and a graphics processing unit (GPU) 149, and the functional blocks of the SoC 140 may communicate with each other via a system bus 141.

The CPU 146 capable of generally controlling an operation of the SoC 140 in the top level may control operations of the other functional blocks, that is, the modem 142, the display controller 143, the memory 144, the external memory controller 145, the CPU 146, the transaction unit 147, the PMIC 148, and the GPU 149. The modem 142 may demodulate a signal received from the outside of the SoC 140, or modulate a signal generated inside the SoC 140 and transmit the modulated signal to the outside. The external memory controller 145 may control an operation of transmitting and receiving data to and from an external memory device connected to the SoC 140. For example, a program and/or data stored in the external memory device may be provided to the CPU 146 or the GPU 149 under control of the external memory controller 145. The GPU 149 may execute program instructions associated with graphics processing. The GPU 149 may receive graphic data through the external memory controller 145 and transmit graphic data processed by the GPU 149 to the outside of the SoC 140 through the external memory controller 145. The transaction unit 147 may monitor a data transaction of each functional block, and the PMIC 148 may control power to be supplied to each functional block, under control of the transaction unit 147. The display controller 143 may transmit data generated inside the SoC 140 to a display (or a display device) outside the SoC 140 by controlling the display. The memory 144 may include a nonvolatile memory such as electrically erasable programmable read-only memory (EEPROM) or flash memory or a volatile memory such as dynamic random access memory (DRAM) or static random access memory (SRAM).

Figure 15:
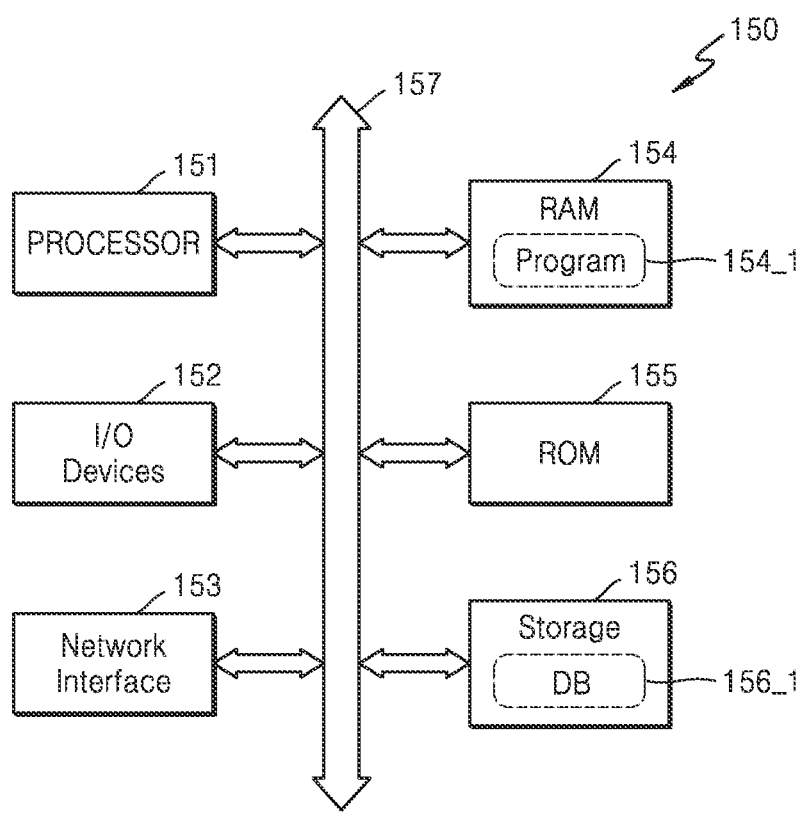
FIG. 15 is a block diagram of a computing system including a memory storing a program, according to an embodiment.

FIG. 15 is a block diagram of a computing system 150 including a memory storing a program, according to an example embodiment. At least some of operations included in a method of designing an IC, in some embodiments, e.g., the method of FIG. 6 and/or the method of FIG. 7, may be performed by the computing system 150 (or computer).

The computing system 150 may be a stationary computing system such as a desktop computer, a workstation, or a server or a portable computing system such as a laptop computer. As shown in FIG. 15, the computing system 150 may include a processor 151, input/output devices 152, a network interface 153, random access memory (RAM) 154, read only memory (ROM) 155, and a storage 156. The processor 151, the input/output devices 152, the network interface 153, the RAM 154, the ROM 155, and the storage 156 may be connected to a bus 157 and communicate with each other via the bus 157.

The processor 151 may be referred to as a processing unit and include at least one core, e.g., a micro-processor, an application processor (AP), a digital signal processor (DSP), and a GPU, capable of executing an arbitrary instruction set (e.g., Intel Architecture-32 (IA-32), 64-bit extended IA-32, x86-64, PowerPC, Sparc, million instructions per second (MIPS), advanced RISC (reduced instruction set computer) machine (ARM), or IA-64). For example, the processor 151 may access a memory, i.e., the RAM 154 or the ROM 155, via the bus 157 and execute instructions stored in the RAM 154 or the ROM 155.

The RAM 154 may store a program 154_1 for a method of designing an IC, according to an example embodiment, or at least a portion of the program 154_1, and the program 154_1 may allow the processor 151 to perform at least some of operations included in the method of designing an IC, e.g., the method of FIG. 6 and/or the method of FIG. 7. For example, the program 154_1 may include a plurality of instructions executable by the processor 151, and the plurality of instructions included in the program 154_1 may allow the processor 151 to perform at least some of the operations included in, for example, the flowchart of FIG. 7.

The storage 156 may not lose stored data even when power supplied to the computing system 150 is cut off. For example, the storage 156 may include a nonvolatile memory device or a storage medium such as magnetic tape, an optical disc, or a magnetic disc. In addition, the storage 156 may be detachable from the computing system 150. The storage 156 may store the program 154_1 according to an example embodiment of the inventive concept, and the program

154_1 or at least a portion of the program 154_1 may be loaded from the storage 156 to the RAM 154 before the program 154_1 is executed by the processor 151. Alternatively, the storage 156 may store a file created by a program language, and the program 154_1 generated from the file by a compiler or the like or at least a portion of the program 154_1 may be loaded to the RAM 154. In addition, as shown in FIG. 15, the storage 156 may include a database 156_1, and the database 156_1 may contain information required to design an IC, e.g., the cell library D12 of FIG. 6.

The storage 156 may store data to be processed by the processor 151 or data processed by the processor 151. That is, the processor 151 may generate data by processing data stored in the storage 156 and store the generated data in the storage 156, according to the program 154_1. For example, the storage 156 may store the RTL data D11, the netlist D13, and/or the layout data D14 of FIG. 6 and store the input data and/or the output data of FIG. 7.

The input/output devices 152 may include input devices such as a keyboard and a pointing device and include output devices such as a display device and a printer. For example, through the input/output devices 152, a user may trigger execution of the program 154_1 by the processor 151, input the RTL data D11 and/or the netlist D13 of FIG. 6 and the input data of FIG. 7, and/or check the layout data D14 of FIG. 6 and the output data of FIG. 7.

The network interface 153 may provide access to a network outside the computing system 150. For example, the network may include a plurality of computing systems and communication links, and the communication links may include wired links, optical links, radio links, or other arbitrary-types of links.

While the disclosure has been particularly shown and described with reference to embodiments thereof, it will be understood that various changes in form and details may be made therein without departing from the spirit and scope of the following claims.

What is claimed is:

1. An integrated circuit (IC) comprising:
   a plurality of first cells placed in a series of first rows, the series of first rows extending in a first horizontal direction and each first row of the series of first rows having a first height; and
   a plurality of second cells placed in a series of second rows, the series of second rows extending in the first horizontal direction and each second row of the series of second rows having a second height different from the first height,
   wherein a sum of heights of all first rows of the series of first rows corresponds to a multiple of a height of a first multi-height cell that has a maximum height among the plurality of first cells.

2. The IC of claim 1, further comprising:
   a plurality of third cells placed in a series of third rows, the series of third rows extending in the first horizontal direction and each third row of the series of third rows having the first height; and
   a plurality of fourth cells placed in a series of fourth rows, the series of fourth rows extending in the first horizontal direction and each fourth row of the series of fourth rows having the second height,
   wherein a sum of heights of all third rows of the series of third rows corresponds to a multiple of a height of a third multi-height cell that has a maximum height among the plurality of third cells.

3. The IC of claim 2, wherein the total height of the series of first rows and the total height of the series of third rows are equal to a multiple of a height of a cell that has a maximum height between the height of the first multi-height cell and the height of the third multi-height cell.

4. The IC of claim 2, wherein the series of first rows, the series of second rows, the series of third rows, and the series of fourth rows are sequentially and adjacently placed in a second horizontal direction crossing the first horizontal direction.

5. The IC of claim 2, comprising:
   a first block comprising the plurality of first cells and the plurality of second cells; and
   a second block comprising the plurality of third cells and the plurality of fourth cells,
   wherein a row count of the series of first rows differs from a row count of the series of third rows.

6. The IC of claim 1, further comprising a plurality of fifth cells placed in a series of fifth rows, the series of fifth rows extending in the first horizontal direction and each fifth row of the series of fifth rows having a third height different from the first height and the second height,
   wherein a sum of heights of all fifth rows of the series of fifth rows corresponds to a multiple of a height of a fifth multi-height cell that has a maximum height among the plurality of fifth cells.

7. The IC of claim 1, wherein each of the plurality of first cells comprises at least one first gate electrode extending in a second horizontal direction crossing with the first horizontal direction,
   wherein each of the plurality of second cells comprises at least one second gate electrode extending in the second horizontal direction, and
   wherein the at least one first gate electrode and the at least one second gate electrode are collinear.

8. The IC of claim 7, wherein each of the plurality of first cells comprises a plurality of first active patterns extending in the first horizontal direction and forming a first transistor with the at least one first gate electrode,
   wherein each of the plurality of second cells comprises a plurality of second active patterns extending in the first horizontal direction and forming a second transistor with the at least one second gate electrode, and
   wherein a number of the plurality of first active patterns differs from a number of the plurality of second active patterns.

9. The IC of claim 1, wherein each of the plurality of first cells comprises at least one first conductive pattern aligned on a plurality of first tracks extending in the first horizontal direction on a first wiring layer,
   wherein each of the plurality of second cells comprises at least one second conductive pattern aligned on a plurality of second tracks extending in the first horizontal direction on the first wiring layer, and
   wherein a number of the plurality of first tracks differs from a number of the plurality of second tracks.

10. An integrated circuit (IC) comprising:
    a series of first power rails extending in a first horizontal direction in parallel to each other with a first pitch;
    a plurality of first cells each configured to receive a first supply voltage or a second supply voltage from at least one power rail of the series of first power rails;
    a series of second power rails extending in the first horizontal direction in parallel to each other with a second pitch different from the first pitch; and
    a plurality of second cells each configured to receive the first supply voltage or the second supply voltage from at least one power rail of the series of second power rails, wherein a pitch between outer first power rails among the series of first power rails corresponds to a multiple of a height of a first multi-height cell that has a maximum height among the plurality of first cells.

11. The IC of claim 10, further comprising:
a series of third power rails extending in the first horizontal direction in parallel to each other with the first pitch;
a plurality of third cells each configured to receive the first supply voltage or the second supply voltage from at least one power rail of the series of third power rails;
a series of fourth power rails extending in the first horizontal direction in parallel to each other with the second pitch; and
a plurality of fourth cells each configured to receive the first supply voltage or the second supply voltage from at least one power rail of the series of fourth power rails,
wherein a pitch between outer third power rails among the series of third power rails corresponds to a multiple of a height of a third multi-height cell that has a maximum height among the plurality of third cells.

12. The IC of claim 11, wherein the pitch between the outer first power rails among the series of first power rails and the pitch between the outer third power rails among the series of third power rails are equal to a multiple of a height of a cell that has a maximum height between the first multi-height cell and the third multi-height cell.

13. The IC of claim 11, comprising:
a first block comprising the plurality of first cells and the plurality of second cells; and
a second block comprising the plurality of third cells and the plurality of fourth cells,
wherein a rail count of the series of first power rails differs from a rail count of the series of third power rails.

14. A method, performed by at least one processor configured to execute a series of instructions, of designing an integrated circuit (IC), the method comprising:
obtaining input data defining cells;
extracting, from the input data, a plurality of first cells with a height corresponding to a multiple of a first height;
detecting a first multi-height cell with a maximum height among the plurality of first cells;
determining a row count of a series of first rows each having the first height, based on the maximum height of the first multi-height cell;
placing at least some of the plurality of first cells in the series of first rows; and
generating output data defining the placed cells.

15. The method of claim 14, further comprising:
extracting, from the input data, a plurality of second cells with a height corresponding to a multiple of a second height different from the first height;
detecting a second multi-height cell with a maximum height among the plurality of second cells;
determining a row count of a series of second rows each having the second height, based on the maximum height of the second multi-height cell; and
placing at least some of the plurality of second cells in the series of second rows.

16. The method of claim 14, wherein the row count of the series of first rows is determined so that a sum of heights of all first rows of the series of first rows is greater than or equal to the maximum height of the first multi-height cell.

17. The method of claim 14, wherein the row count of the series of first rows is determined so that a sum of heights of all first rows of the series of first rows corresponds to a multiple of the maximum height of the first multi-height cell.

18. The method of claim 14, further comprising placing a series of first power rails extending between adjacent first rows of the series of first rows, based on the first multi-height cell.

19. The method of claim 18, wherein the placing of the series of first power rails comprises:
identifying a power rail pair between which the first multi-height cell is placed; and
placing the series of first power rails so that supply voltages applied to respective power rails of the identified power rail pair are applied to respective outer power rails of the series of first power rails.

20. A method of fabricating the IC of claim 14, the method comprising:
manufacturing at least one mask based on the output data of claim 14; and
fabricating the IC by using the manufactured at least one mask.

* * * * *